(12) United States Patent
Tan et al.

(10) Patent No.: US 9,252,270 B2
(45) Date of Patent: Feb. 2, 2016

(54) FLOATING BODY CELL

(71) Applicants: Shyue Seng Tan, Singapore (SG); Eng Huat Toh, Singapore (SG); Elgin Quek, Singapore (SG)

(72) Inventors: Shyue Seng Tan, Singapore (SG); Eng Huat Toh, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 275 days.

(21) Appl. No.: 13/713,393

(22) Filed: Dec. 13, 2012

(65) Prior Publication Data

US 2014/0167161 A1     Jun. 19, 2014

(51) Int. Cl.
| | | |
|---|---|---|
| H01L 21/336 | (2006.01) | |
| H01L 21/8234 | (2006.01) | |
| H01L 29/78 | (2006.01) | |
| H01L 29/786 | (2006.01) | |
| H01L 29/66 | (2006.01) | |

(52) U.S. Cl.
CPC ...... *H01L 29/7841* (2013.01); *H01L 29/78654* (2013.01); *H01L 29/66545* (2013.01)

(58) Field of Classification Search
None
See application file for complete search history.

(56) References Cited

U.S. PATENT DOCUMENTS

| 5,906,951 A  * | 5/1999 | Chu et al. ..................... 438/751 |
| 6,350,993 B1 * | 2/2002 | Chu et al. ..................... 257/19 |
| 2005/0090066 A1* | 4/2005 | Zhu et al. ..................... 438/300 |
| 2007/0117297 A1* | 5/2007 | Bae et al. ..................... 438/197 |
| 2011/0291184 A1* | 12/2011 | Yin et al. ..................... 257/330 |
| 2013/0292767 A1* | 11/2013 | Yang et al. ..................... 257/347 |

OTHER PUBLICATIONS

Ki-Whan Song et al. "55 nm Capacitor-less 1T DRAM Cell Transistor with Non-Overlap Structure," 2008 IEEE, pp. 797-800.
Jin-Woo Han et al. "Band Offset FinFET-Based URAM (Unified-RAM) Built on SiC for Multi-Functioning NVM and Capacitorless 1T-DRAM," 2008 IEEE, 2008 Symposium on VLSI Technology Digest of Technical Papers, pp. 200-201.
Jin-Woo Han et al. "Energy Band Engineered Unified-RAM (URAM) for Multi-Functioning 1T-DRAM and NVM," 2008 IEEE, pp. 227-230.
Fumiyoshi Matsuoka et al. "FBC's Potential of 6F2 Single Cell Operation in Multi-Gbit Memories Confirmed by a Newly Developed Method for Measuring Signal Sense Margin," 2007 IEEE, pp. 39-42.
Ibrahim Ban et al. "Floating Body Cell with Independently-Controlled Double Gates for High Density Memory," 2006 IEEE, 4 pages.
Tomoaki Shino et al. "Floating Body RAM Technology and its Scalability to 32nm Node and Beyond," 2006 IEEE, 4 pages.

* cited by examiner

*Primary Examiner* — Evan Pert
*Assistant Examiner* — Shaka White
(74) *Attorney, Agent, or Firm* — Ditthavong & Steiner, P.C.

(57) ABSTRACT

Methods of forming a floating body cell (FBC) with faster programming and lower refresh rate and the resulting devices are disclosed. Embodiments include forming a silicon on insulator (SOI) layer on a substrate; forming a band-engineered layer surrounding and/or on the SOI layer; forming a source region and a drain region with at least one of the source region and the drain region being on the band-engineered layer; and forming a gate on the SOI layer, between the source and drain regions.

13 Claims, 54 Drawing Sheets

FLOATING BODY CELL

TECHNICAL FIELD

The present disclosure relates to a floating body cell (FBC). The present disclosure is particularly applicable to forming FBCs in semiconductor devices.

BACKGROUND

FBCs are simple and attractive in terms of scaling over conventional dynamic random-access memory (DRAM) because of the FBCs' capacitor-less structure. FBCs make use of a floating body to store data in the form of a floating body potential. For example, the value 1 is achieved in FBCs when a positive voltage is applied to a bitline (BL) to initialize impact ionization, and holes are accumulated in the body that raise the body potential. The value 0 is achieved when a negative voltage is applied to the BL, and holes are extracted from the body and reduce the body potential. Despite the foregoing, FBCs still experience issues associated with DRAM, such as refresh procedures to replenish the charge lost during read or after prolonged use. Additionally, limited data storage capacity in FBCs exacerbates the refresh rate issue.

A need therefore exists for methodology enabling formation of improved FBCs with faster programming and lower refresh rates, and the resulting device.

SUMMARY

An aspect of the present disclosure is an efficient method for forming an FBC with faster programming and a lower refresh rate.

Another aspect of the present disclosure is an FBC with faster programming and a lower refresh rate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon on insulator (SOI) layer on a substrate; forming a hetero junction band-engineered layer (band-engineered layer) surrounding and/or on the SOI layer; forming a source region and a drain region with at least one of the source region and the drain region being on the band-engineered layer; and forming a gate on the SOI layer, between the source and drain regions.

Aspects of the present disclosure include forming the gate prior to the band-engineered layer, forming a hard mask on the gate, recessing the SOI layer forming recesses on each side of the gate, forming the band-engineered layer lining the recesses, forming the source region and the drain region on the band-engineered layer, and removing the hard mask. Additional aspects include forming a gate oxide layer on the SOI layer prior to forming the gate, and forming the source and drain regions coplanar with the gate oxide layer. Further aspects include forming a silicon layer on the band-engineered layer, forming a dummy gate on the silicon layer prior to forming the source region and the drain region, and forming the gate by: removing the dummy gate, the silicon layer and the band-engineered layer below the dummy gate, forming a cavity, forming a gate oxide layer on sidewalls and a bottom surface of the cavity, and filling the cavity with a gate material. An additional aspect includes forming the band-engineered layer as a multi-layer stack. Another aspect includes forming the band-engineered layer with a decreasing concentration of germanium (Ge) from a bottom surface of the multi-layer stack to a top surface of the multi-layer stack. Further aspects include recessing the SOI layer, forming a gate oxide layer on a sidewall and a bottom surface of the recess, forming a gate on the gate oxide layer, recessing the SOI layer on each side of the gate, forming the band-engineered layer on the recessed SOI layer, and forming the source region and the drain region on the band-engineered layer. Additional aspects include forming a silicon layer on the band-engineered layer, etching a portion of the silicon layer, the band-engineered layer, and the SOI layer, forming a gate oxide layer on a sidewall and a bottom surface of the etched portion, and forming a gate on the gate oxide layer, prior to forming the source and drain regions. Yet another aspect includes forming a buried oxide (BOX) layer on the substrate prior to forming the SOI layer.

Another aspect of the present disclosure is a device including: a SOI layer on a substrate, a gate on the SOI layer, a band-engineered layer on the SOI layer, on at least one side of the gate, and a source region and a drain region at opposite sides of the gate, at least one of the source region and the drain region being on the band-engineered layer.

Aspects include the SOI layer being recessed on each side of the gate, the band-engineered layer lining each recess, and both the source region and the drain region being formed on the band-engineered layer. Another aspect includes the source region and the drain region extending above a top surface of the SOI layer. Further aspects include a gate oxide layer on side and bottom surfaces of the gate, and the band-engineered layer being on both sides of the gate. Yet another aspect includes the band-engineered layer including a multi-layer stack under the gate and on both sides of the gate. An additional aspect includes the multi-layer stack including Ge with an increasing concentration from a bottom surface of the multi-layer stack to a top surface of the multi-layer stack. Additional aspects include a portion of the SOI layer being recessed, a gate oxide layer lining a side surface and a portion of a bottom surface of the recess, forming an L-shape, the gate being formed on the gate oxide layer, and the band-engineered layer being on a non-recessed portion of the SOI layer. Additional aspects include a first recess in the SOI layer having a first depth, a gate oxide layer lining a side surface and a portion of a bottom surface of the first recess, forming an L-shape, the gate being formed on the gate oxide layer, a second recess in the SOI layer having a second depth, less than the first depth at one side of the gate, a third recess in the SOI layer having a third depth at the other side of the gate, wherein the band-engineered layer lines the second and third recesses and both the source region and the drain region are formed on the band-engineered layer. Another aspect includes a BOX layer under the SOI layer.

Another aspect of the present disclosure includes: forming a BOX layer on a silicon substrate, forming a SOI layer on the BOX layer, forming a gate on the SOI layer, forming a band-engineered layer on the SOI layer at least at one side of the gate, forming a silicon layer on the band-engineered layer, and forming source and drain regions at opposite sides of the gate, each in either the silicon layer or the SOI layer. An additional aspect includes forming a gate oxide layer prior to forming the gate, the gate oxide layer being formed on a bottom surface and at least one side surface of the gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of refresh and programming rates attendant upon utilizing FBCs for DRAMs. In accordance with embodiments of the present disclosure, an FBC is formed with a band-engineered layer to improve the programming and refresh rates. An FBC with a band-engineered layer experiences a smaller energy potential for the impact ionization rate thereby resulting in greater impact ionization for faster programming and a lower refresh rate. Embodiments of FBCs according to the present disclosure may also include a larger storage volume leading to larger memory windows that prolong retention and lower refresh rates.

Methodology in accordance with embodiments of the present disclosure includes forming a BOX layer on a silicon substrate, forming a SOI layer on the BOX layer, forming a gate on the SOI layer, forming a band-engineered layer on the SOI layer at least at one side of the gate, forming a silicon layer on the band-engineered layer, and forming source and drain regions at opposite sides of the gate, each in either the silicon layer or the SOI layer.

Figure 1:
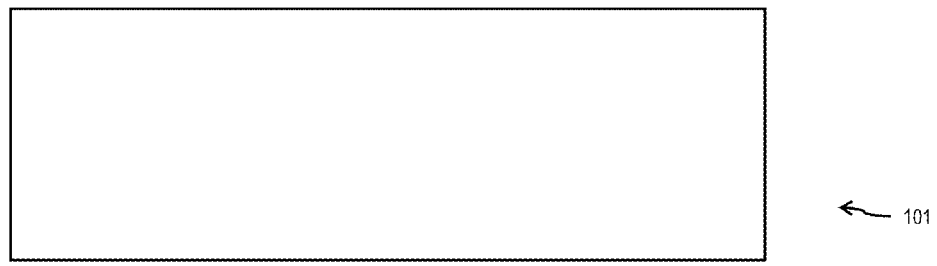
FIGS. 1 through 10 schematically illustrate a method for forming an FBC with faster programming and a lower refresh rate, in accordance with an exemplary embodiment.
Figure 2:
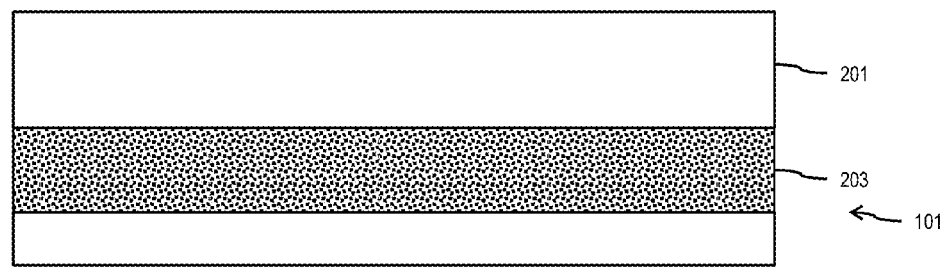

Adverting to FIG. 1, a method of forming an FBC with a faster programming rate and a lower refresh rate, according to an exemplary embodiment, begins with a substrate 101. The substrate 101 may be formed of silicon (Si). Next, as illustrated in FIG. 2, a SOI layer 201 may be formed by forming a BOX layer 203 within the substrate 101. The BOX layer 203 may be formed by oxygen implantation in the substrate 101 followed by a high temperature anneal to create a BOX layer 203 formed of silicon dioxide. As a result, a SOI layer 201 is formed above the BOX layer 203. The SOI layer 201 may be 5 to 30 nanometers (nm) thick for a fully depleted SOI and 50 to 80 nm thick for a partially-depleted SOI.

Figure 3:
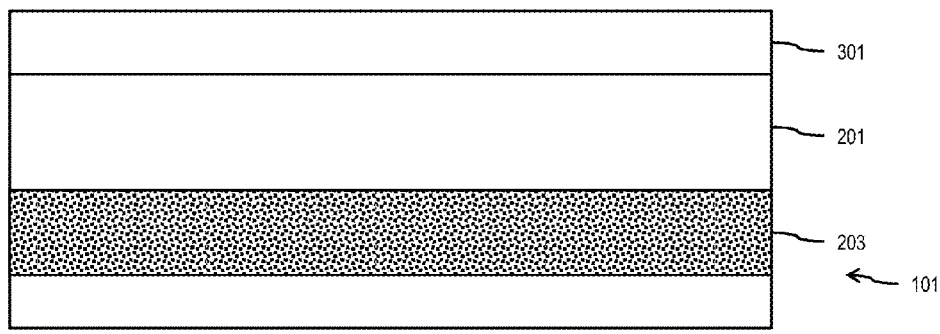
Figure 4:
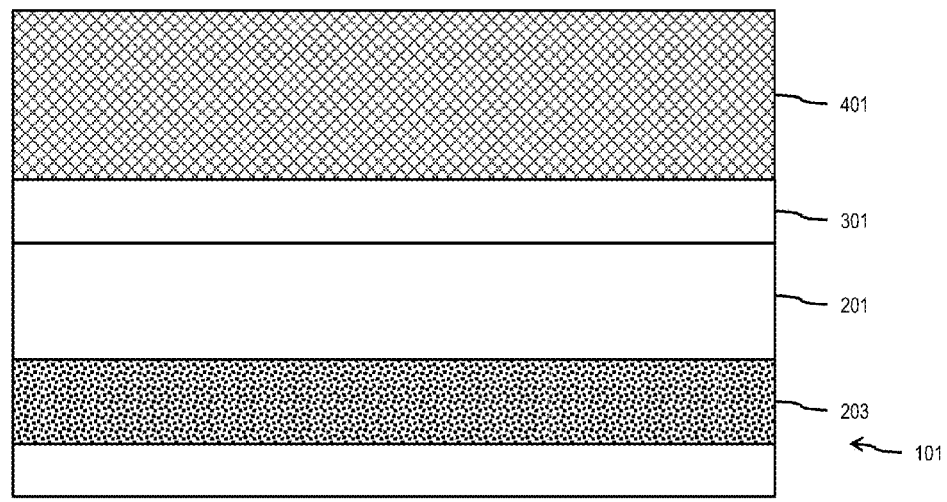
Figure 5:
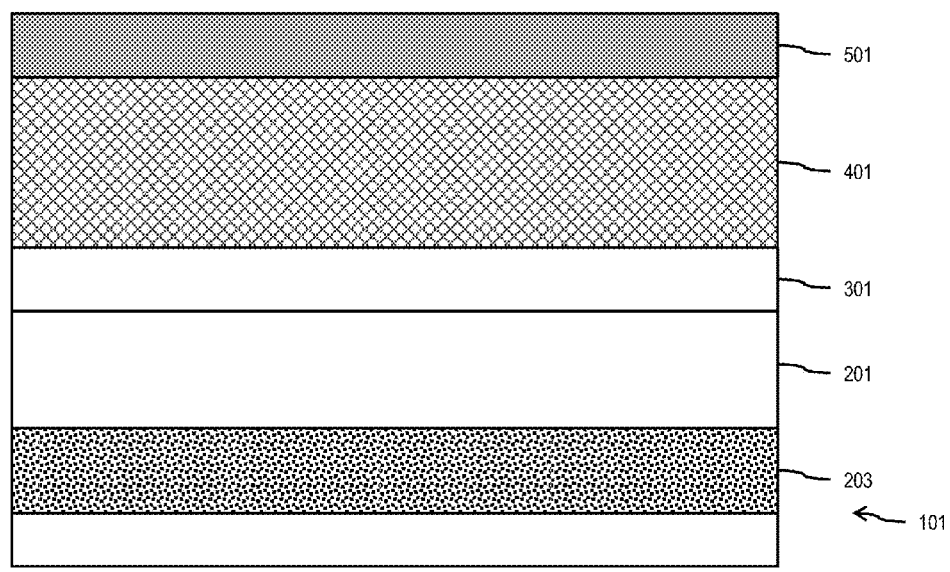
Figure 6:
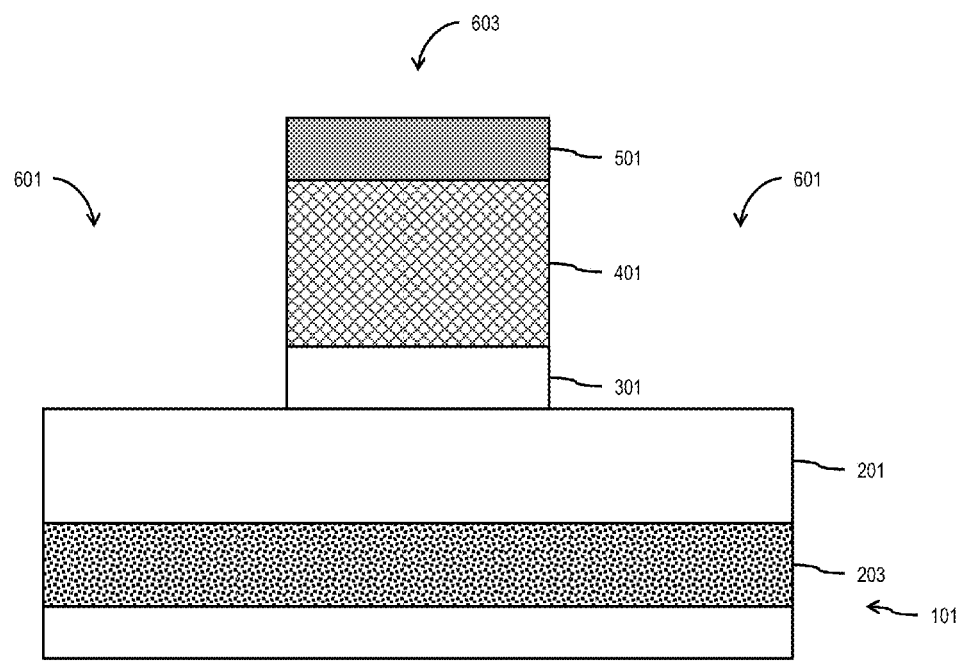
Figure 7:
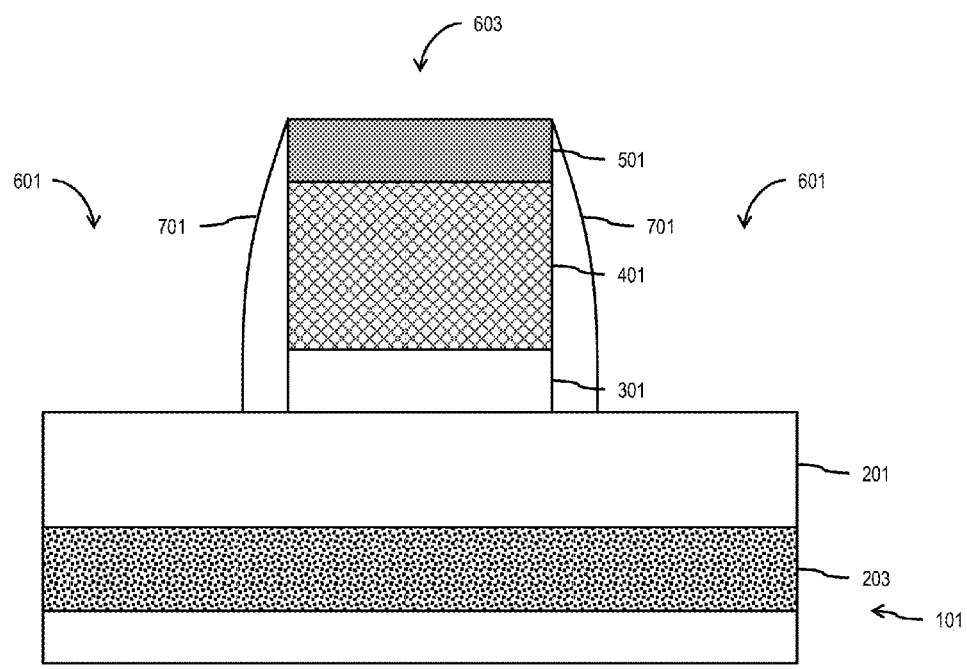

As illustrated in FIG. 3, a gate oxide layer 301 is formed above the SOI layer 201. The gate oxide layer 301 may be formed of any gate oxide material. Further, as illustrated in FIG. 4, a poly-silicon (poly-Si) layer 401 may be formed above the gate oxide layer 301. Further, a hard mask layer 501 may be formed above the poly-Si layer 401, as illustrated in FIG. 5. The hard mask layer 501 may be patterned and subsequently etched by a reactive ion etch (RIE) to form recesses 601 in the hard mask layer 501, the poly-Si layer 401 and the gate oxide layer 301, as illustrated in FIG. 6, thereby forming a gate stack 603 on the SOI layer 201. Further, spacers 701 may be formed on either side of the gate 603 (FIG. 7).

Figure 8:
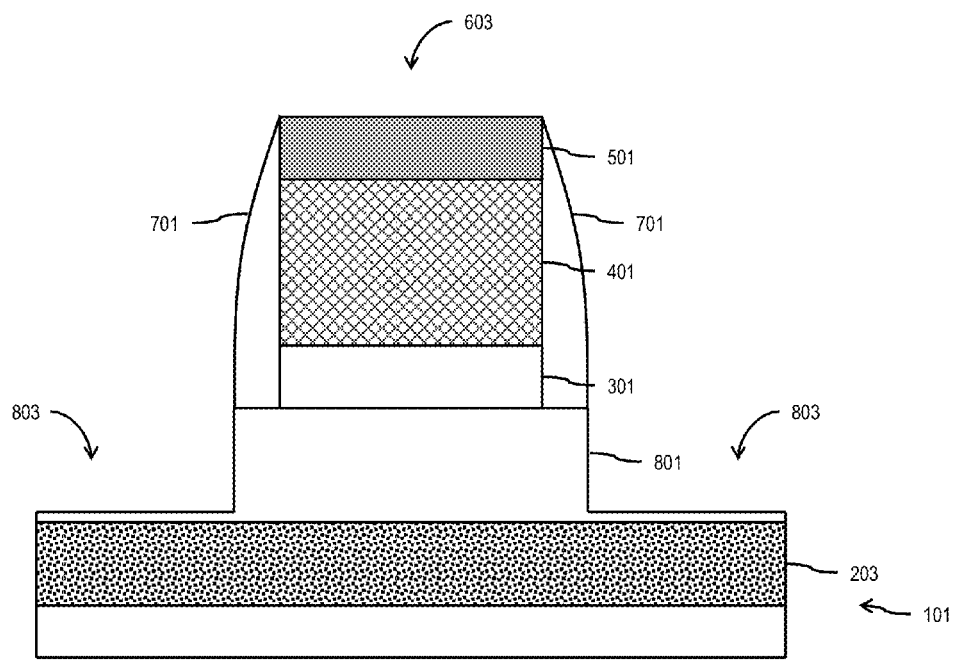

Adverting to FIG. 8, the gate stack 603 and the spacers 701 may be used as a mask to form recesses 803 in the SOI layer 201 thereby forming a patterned SOI layer 801. An RIE may be used to form the recesses 803. As illustrated in FIG. 8, the recesses 803 may be formed in the SOI layer 201 substantially down to the BOX layer 203. For example, at recesses 803, the SOI layer 201 may be 1 to 5 nm in depth.

Figure 9:
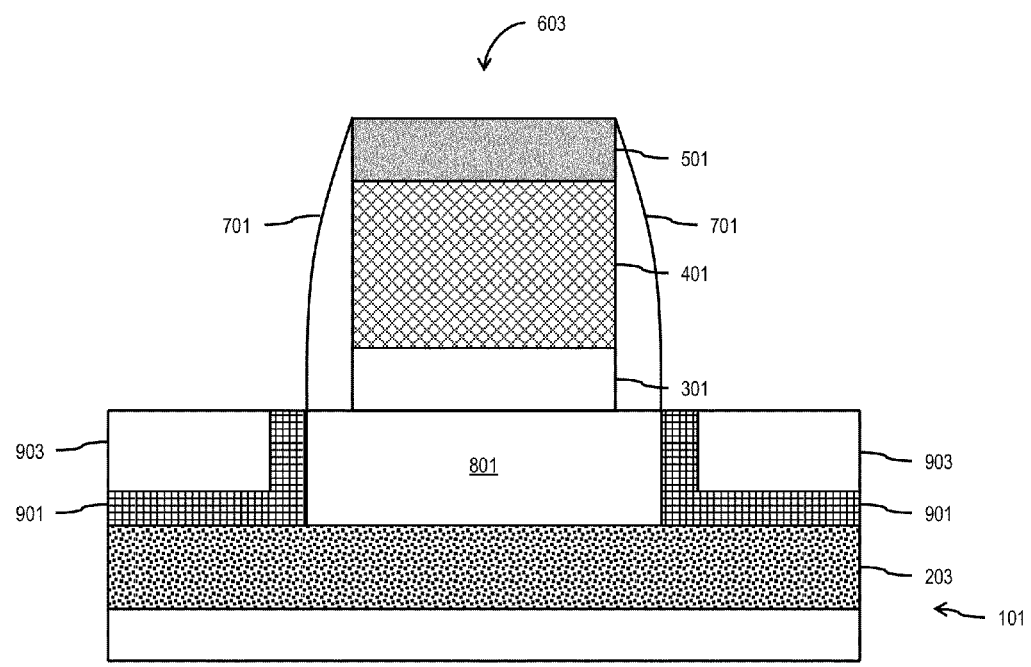
Figure 10:
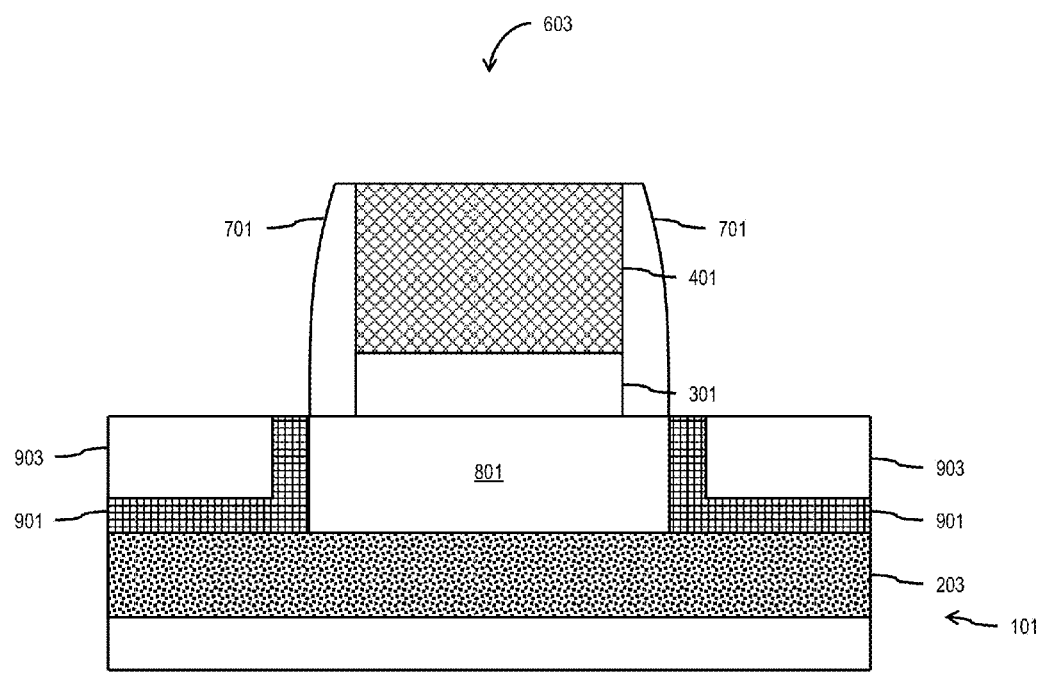

Adverting to FIG. 9, the recesses 803 may subsequently be lined with a band-engineered layer 901. The band-engineered layer 901 can be p-doped or un-doped Si—Ge or Ge when the SOI layer 201 is p-type and may be formed to a thickness of 1 to 5 nm. Subsequently, the remaining recesses 803 may be filled with Si and in-situ doped to form source and drain regions 903 that are 5 to 30 nm thick. After the source and drain regions 903 are formed, they may be laser annealed at 1000 to 1200° C. to activate the source/drain junction without diffusion. Then, the hard mask layer 501, in addition to parts of the spacers 701, may be removed, such as by chemical mechanical polishing (CMP), resulting in an FBC with faster programming and a lower refresh rate, as illustrated in FIG. 10.

Figure 11:
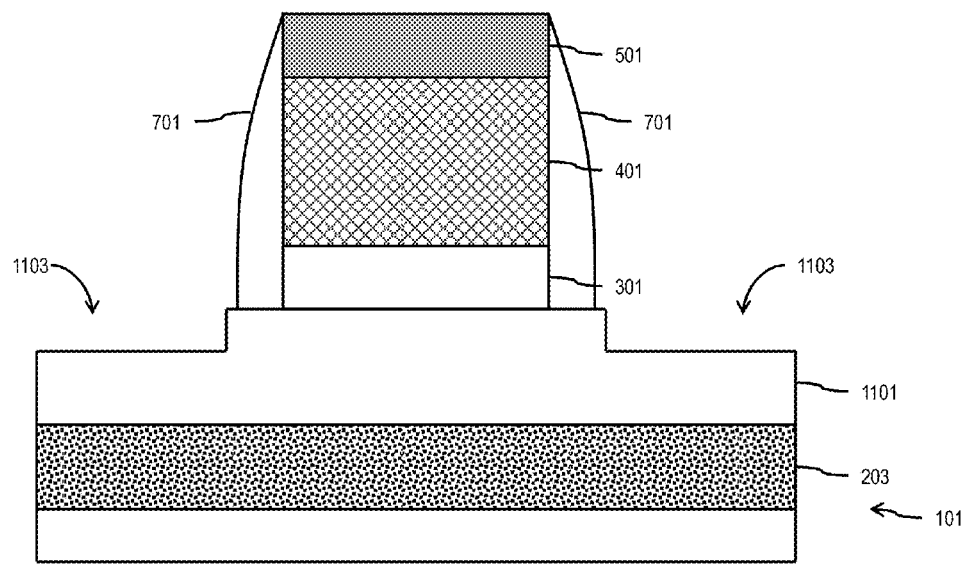
FIGS. 11 through 13 schematically illustrate a method for forming an alternative FBC with faster programming and a lower refresh rate, in accordance with an exemplary embodiment.
Figure 12:
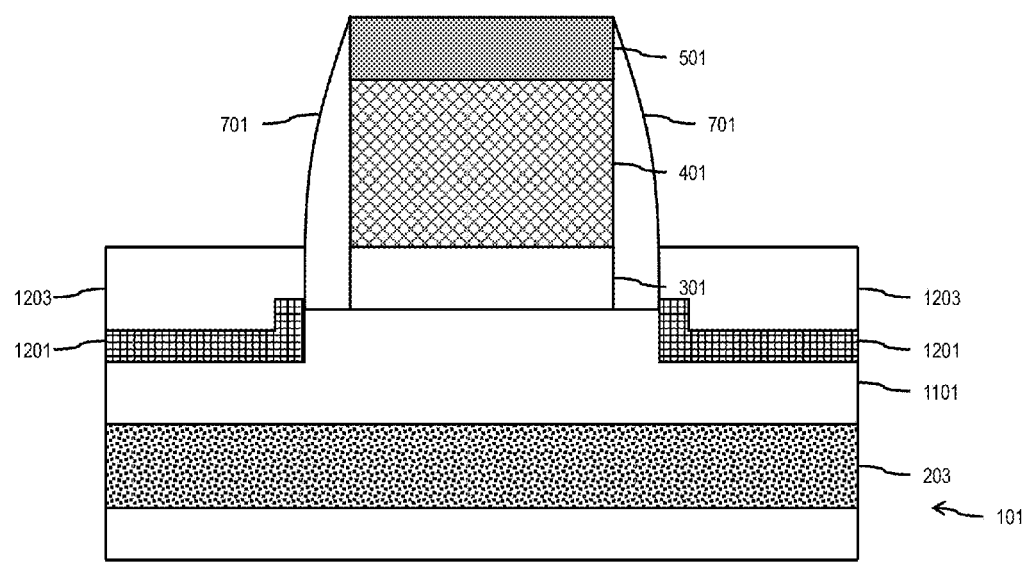
Figure 13:
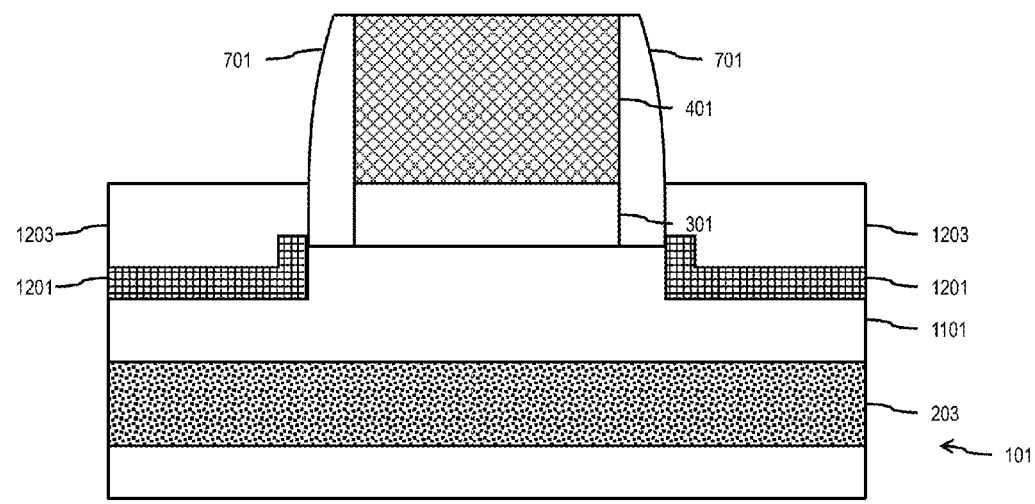

A method of forming an FBC with faster programming and a lower refresh rate, according to an alternative exemplary embodiment, may begin similar to FIGS. 1 through 8 of the method discussed above. However, as illustrated in FIG. 11, less deep recesses 1103 (for example to a depth of 2.5 to 15 nm, around half of the initial SOI thickness) may be formed in the SOI layer 201 that do not extend down to the BOX layer 203, forming a patterned SOI layer 1101. Subsequently a band-engineered layer 1201 may be formed to line the recesses 1103, as illustrated in FIG. 12. The band-engineered layer 1201 can be p-doped or un-doped Si—Ge or Ge when the SOI layer 1101 is p-type and may be formed to a thickness of 1 to 5 nm. Further, an Si layer may be grown above the band-engineered layer 1201 to fill the recesses 1103, which may be in-situ doped to form raised source and drain regions 1203 at a thickness of 5 to 30 nm. After the source and drain regions 1203 are formed, they may be laser annealed at 1000 to 1200° C. The recesses 1103 may be formed such that the raised source and drain regions 1203 are coplanar with the gate oxide layer 301. After formation of the source and drain regions 1203, the hard mask layer 501, in addition to parts of the spacers 701, may be removed, as illustrated in FIG. 13, resulting in an FBC with faster programming and a lower refresh rate. Further, by forming shallower recesses 1103, a larger data storage volume is generated in the SOI layer 1101, improving charge retention and data storage volume and lowering the refresh rate of the FBC.

Although the resulting FBC is illustrated as including the band-engineered layer 1201, alternatively the FBC may exclude the band-engineered layer 1201. In this case, the enlarged storage volume of the raised source and drain regions 1203 and the SOI layer 1101 provides improved charge retention and a lowered refresh rate, though the programming speed may be slower.

Figure 14:
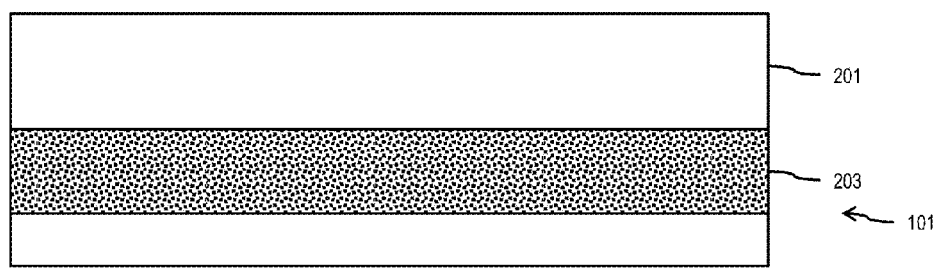
FIGS. 14 through 21 schematically illustrate a method for forming an alternative FBC with faster programming and a lower refresh rate, in accordance with an exemplary embodiment.
Figure 15:
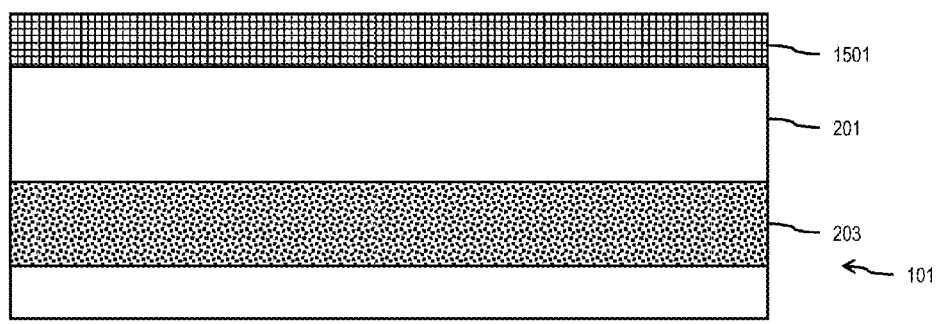

Adverting to FIG. 14, a method of forming an FBC with faster programming and a lower refresh rate, according to another exemplary embodiment, begins with a substrate 101 with a SOI layer 201 and a BOX layer 203, similar to FIG. 2 discussed above. As illustrated in FIG. 15, a band-engineered layer 1501 may be formed on the SOI layer 201. As discussed above, the band-engineered layer 1501 can be p-doped or un-doped Si—Ge or Ge when the SOI layer 201 is p-type and may be formed to a thickness of 1 to 5 nm.

Figure 16:
Figure 17:
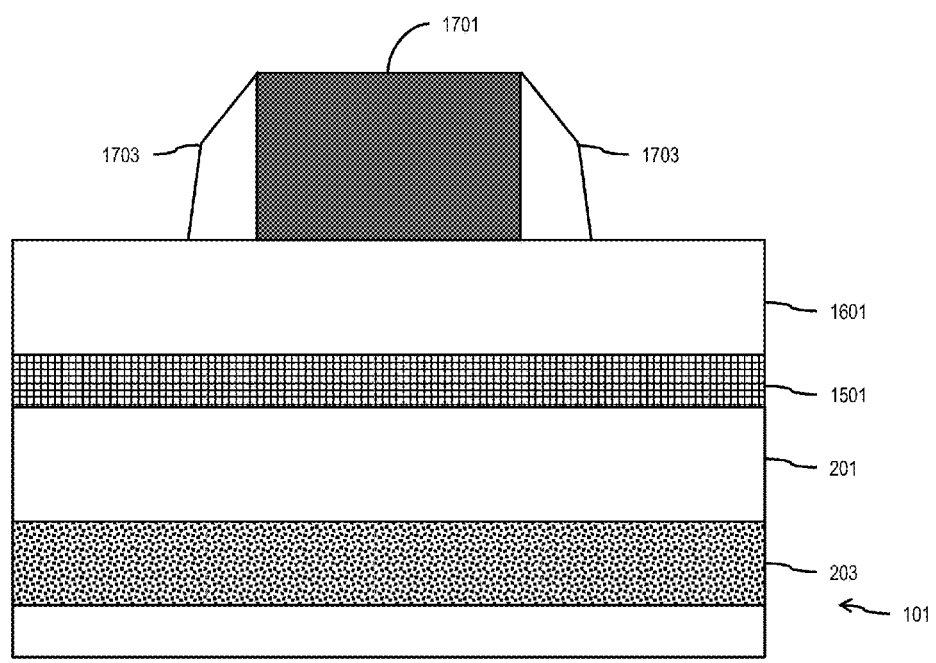
Figure 18:
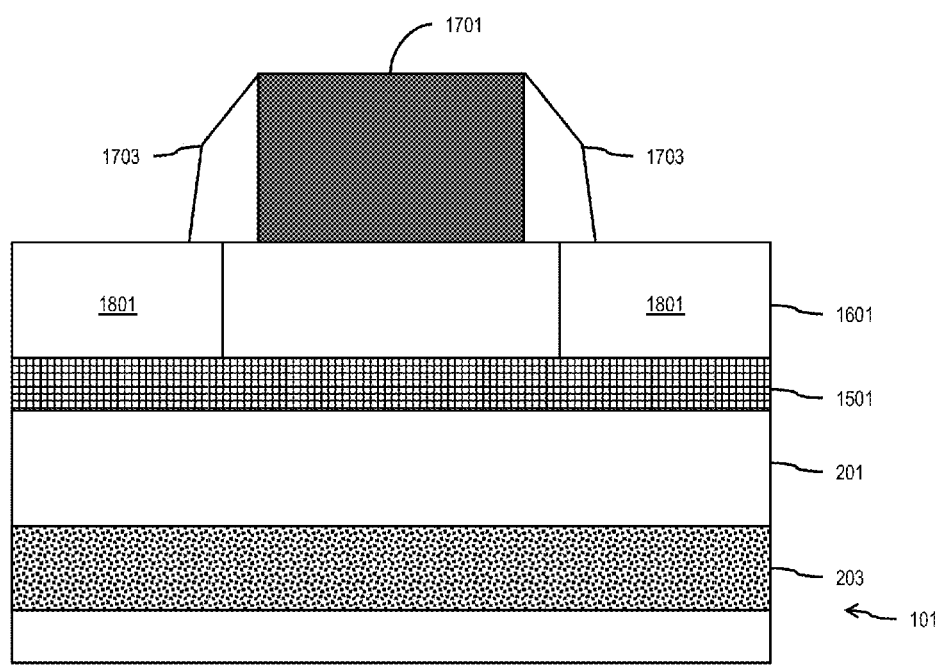

Next, a Si layer 1601 may be formed on the band-engineered layer 1501, as illustrated in FIG. 16. The Si layer 1601 may be formed to a thickness of 5 to 30 nm. Further, a sacrificial layer 1603 may be formed on the Si layer 1601. The sacrificial layer may be subsequently patterned and etched to form a dummy gate 1701, as illustrated in FIG. 17. Spacers 1703 may be formed on opposite sides of the dummy gate 1701. The spacers 1703 may be formed of an inter-layer dielectric (ILD) material and may be laser annealed. After the spacers 1703 are formed, source and drain regions 1801 (FIG. 18) may be implanted within the Si layer 1601 on opposite sides of the spacers 1703. After formation of the source and drain regions 1801, the source and drain regions 1801 may be laser annealed at 1000 to 1200° C.

Figure 19:
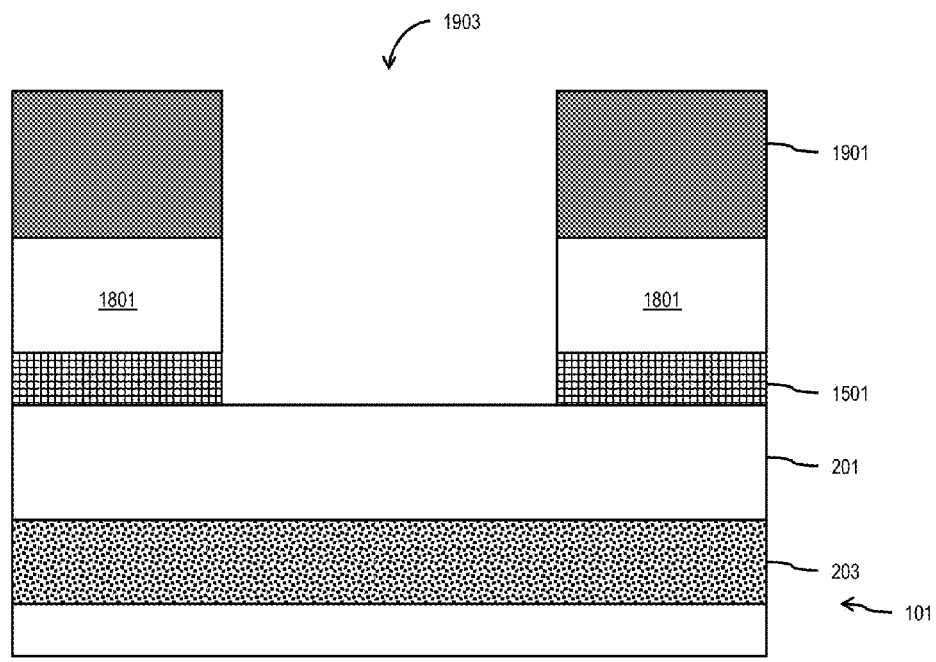
Figure 20:
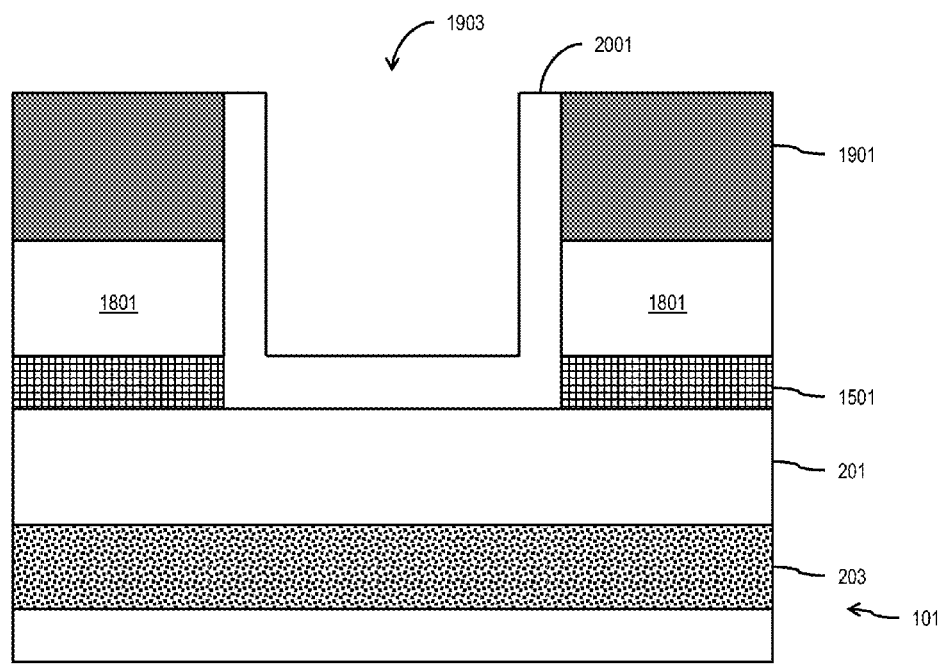
Figure 21:
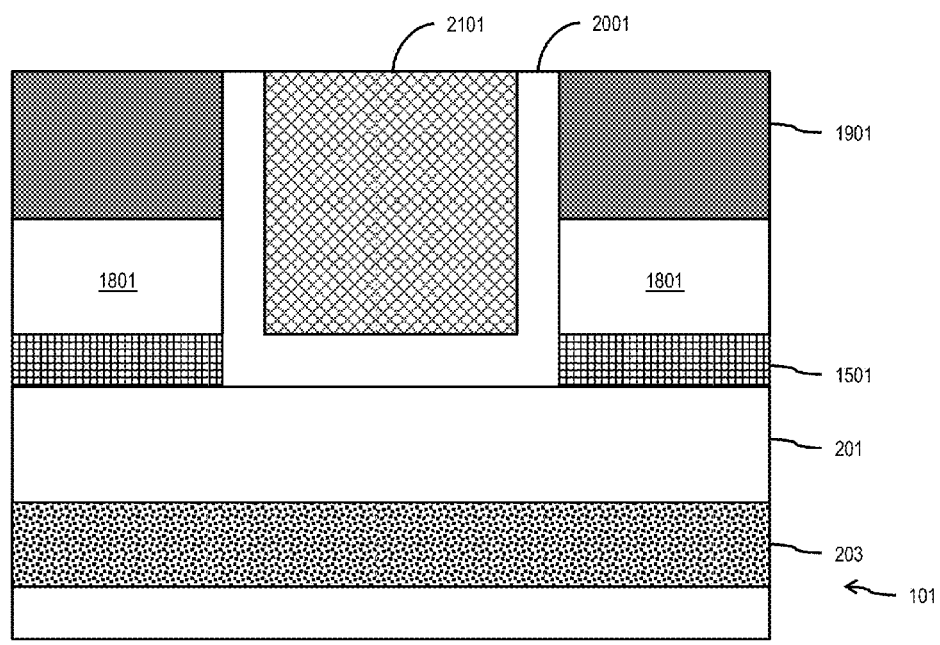

An ILD 1901 may be subsequently formed above the source and drain regions 1801, the dummy gate 1701 and the spacers 1703. After formation of the ILD 1901, the ILD 1901 may be removed down to the dummy gate 1701, such as by CMP. Then, the dummy gate 1701 and the portion of the Si layer 1601 and the band-engineered layer 1501 directly below the dummy gate 1701 are removed, forming the cavity 1903, as illustrated in FIG. 19. An etch may be used to remove the portion of the Si layer 1601 and the portion of the band-engineered layer 1501 to form the cavity 1903. Next, a gate oxide layer 2001 may be formed on sidewalls and a bottom surface of the cavity 1903, as illustrated in FIG. 20. Adverting to FIG. 21, after formation of the gate oxide layer 2001, the cavity 1903 may be filled with a gate material 2101, such as poly-Si, resulting in an FBC with faster programming and a lower refresh rate and a larger data storage volume.

Although the resulting FBC is illustrated as including the band-engineered layer 1501, alternatively the FBC may exclude the band-engineered layer 1501. In this case, the enlarged storage volume of the raised source and drain regions 1801 and the SOI layer 201 provides improved charge retention and a lowered refresh rate, though the programming speed may be slower.

Figure 22:
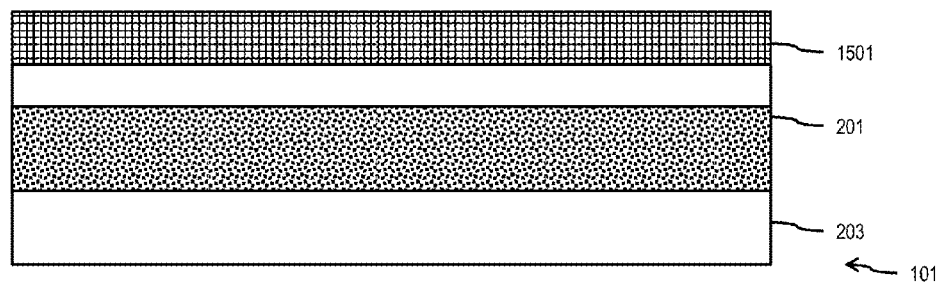
FIGS. 22 through 30 schematically illustrate a method for forming an alternative FBC with faster programming and a lower refresh rate, in accordance with an exemplary embodiment.
Figure 23:
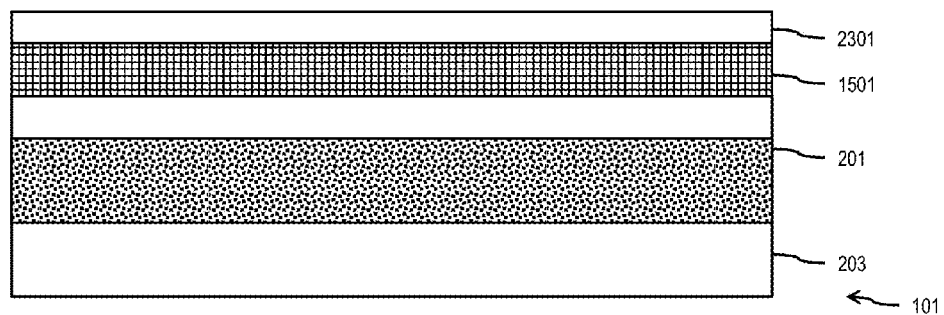
Figure 24:
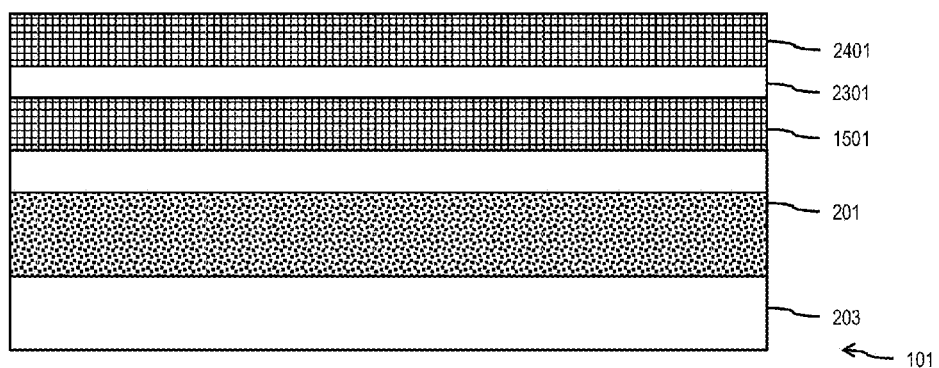
Figure 25:
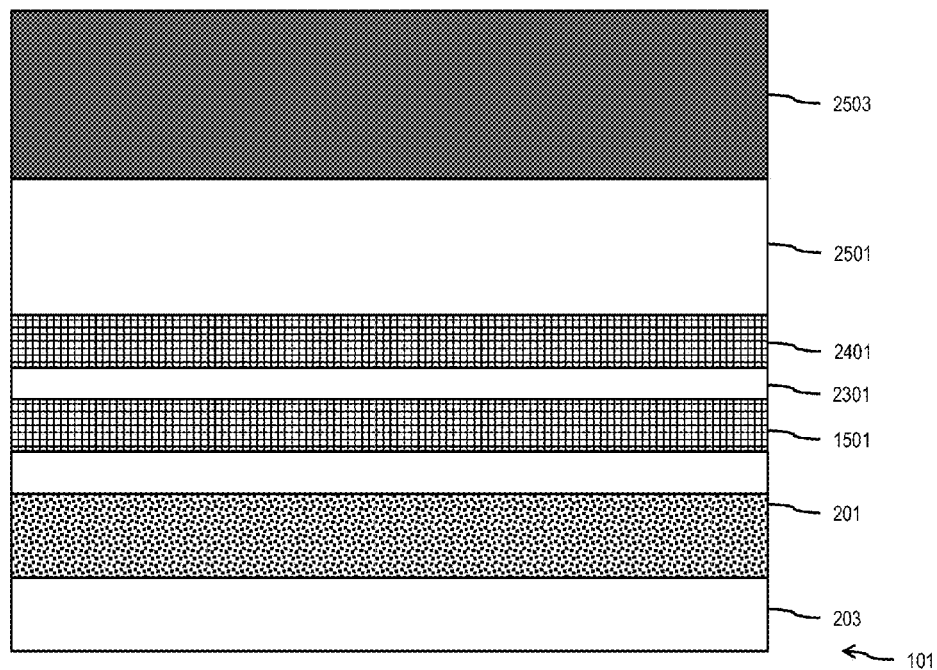
Figure 26:
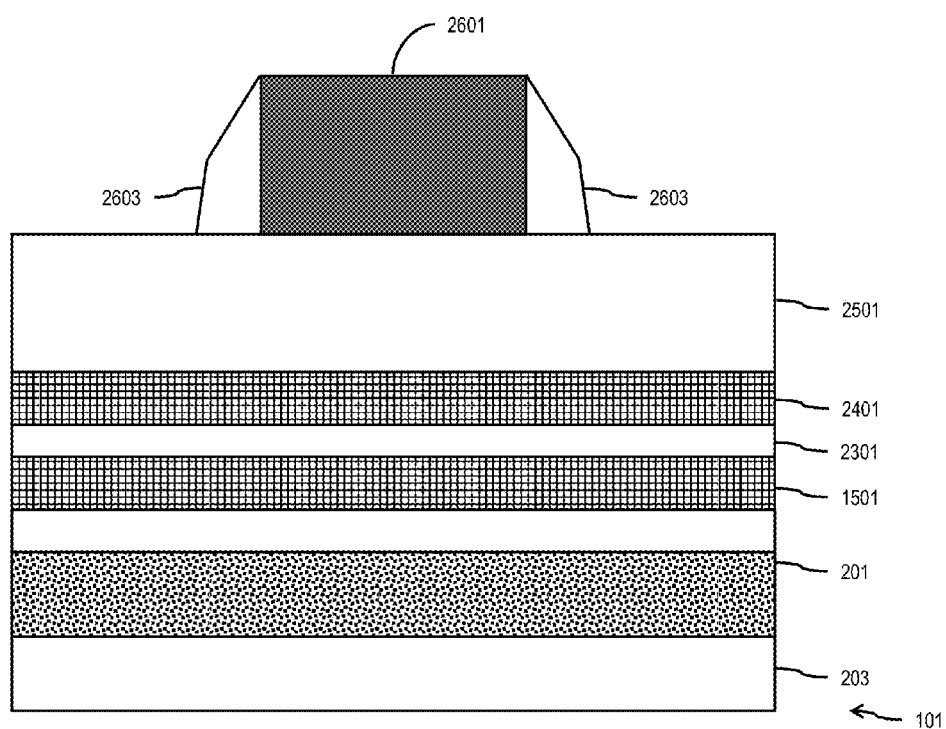
Figure 27:
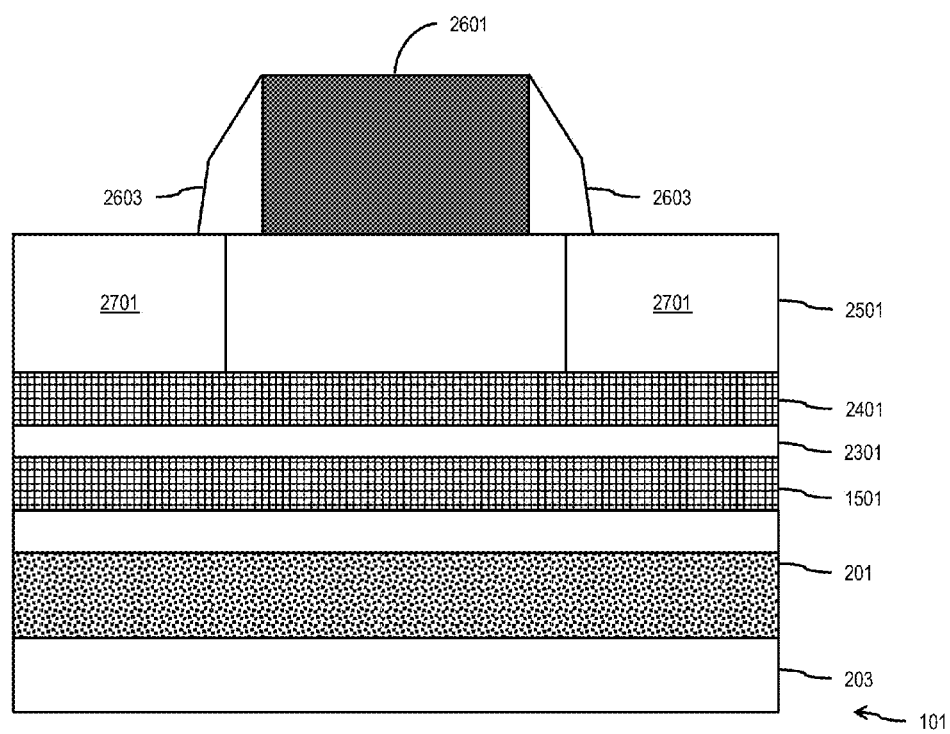

Adverting to FIG. 22, the method described above with respect to FIGS. 14 through 21 may alternatively include a multi-layer stack of SiGe/Si/SiGe for the band-engineered layer. As illustrated in FIG. 22, the process may begin the same as the structure shown in FIG. 15 with the band-engineered layer 1501, the SOI layer 201 and the BOX layer 203 within the substrate 101. However, the SOI layer 201 may be thinner than in the structure of FIG. 15. A Si layer 2301 may be deposited on the band-engineered layer 1501, as illustrated in FIG. 23. The Si layer 2301 may be thinner than the Si layer 1601, for example having a thickness of 2 to 15 nm. Subsequently, a second band-engineered layer 2401 may be formed on the Si layer 2301. The second band-engineered layer 2401 can be p-doped or un-doped Si—Ge or Ge when the SOI layer 201 is p-type and may be formed to a thickness of 1 to 5 nm. Thus, a multi-layer stack of band-engineered layers is created. Forming additional layers of Si and band-engineered layers may occur to increase the number of band-engineered layers within the multi-layer stack. Next, another Si layer 2501 may be formed on the second (or top) band-engineered layer 2401. The Si layer 2501 may be thicker than the Si layer 2301, such as 5 to 30 nm thick. Subsequent to formation of the Si layer 2501, a sacrificial layer 2503 may be formed on the Si layer 2501. The sacrificial layer 2503 may be subsequently patterned and etched to form a dummy gate 2601, as illustrated in FIG. 26. Spacers 2603 may be formed on either side of the dummy gate 2601. The spacers 2603 may be formed of an ILD material. After formation of the spacers 2603, source and drain regions 2701 (FIG. 27) may be formed within the Si layer 2501 on opposite sides of and below the spacers 2603, and the source and drain regions 2603 may be laser annealed at 1000 to 1200° C.

Figure 28:
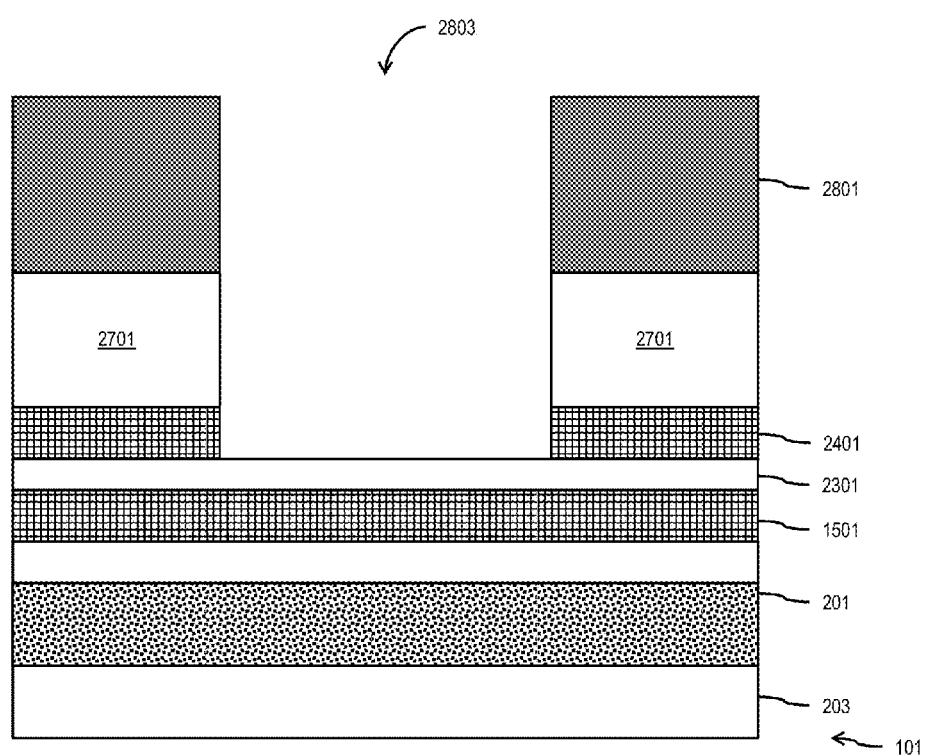
Figure 29:
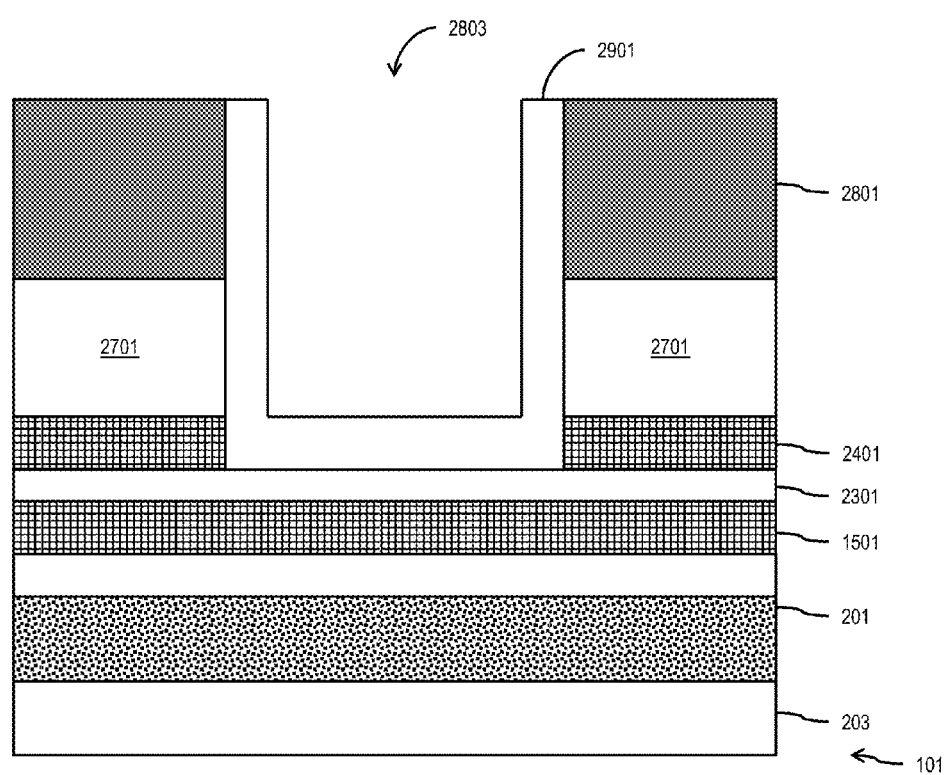
Figure 30:
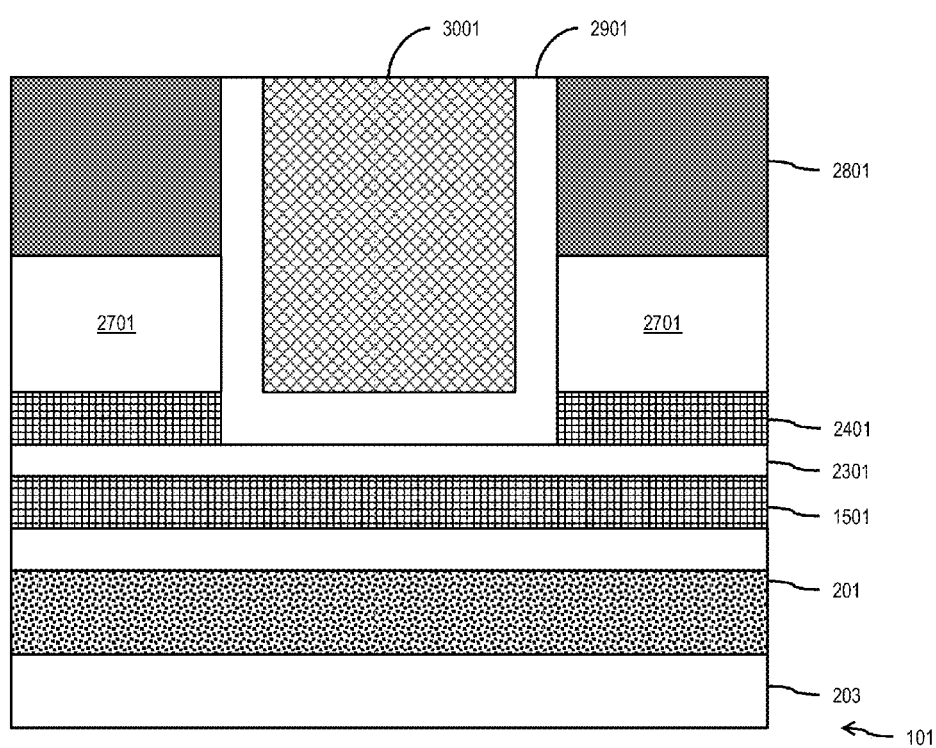

An ILD 2801 may be subsequently formed above the source and drain regions 2701, the dummy gate 2601 and the spacers 2603. The ILD 2801 may then be removed down to the dummy gate 2601, such as by CMP, and the dummy gate 2601 and the portion of the Si layer 2501 and the second band-engineered layer 2401 directly below the dummy gate 2601 may be removed, forming the cavity 2803, as illustrated in FIG. 28. An etch may be used to remove the portion of the Si layer 2501 and the second band-engineered layer 2401 to form the cavity 2803. Next, a gate oxide layer 2901 may be formed on sidewalls and a bottom surface of the cavity 2803, as illustrated in FIG. 29. Adverting to FIG. 30, the cavity 2803 may be filled with a gate material 3001, such as poly-Si, resulting in an FBC with faster programming and a lower refresh rate and larger data storage volume.

Figure 31:
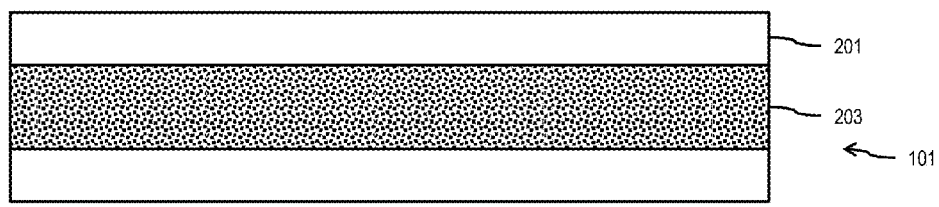
FIGS. 31 through 39 schematically illustrate a method for forming an alternative FBC with faster programming and a lower refresh rate, in accordance with an exemplary embodiment.
Figure 32:
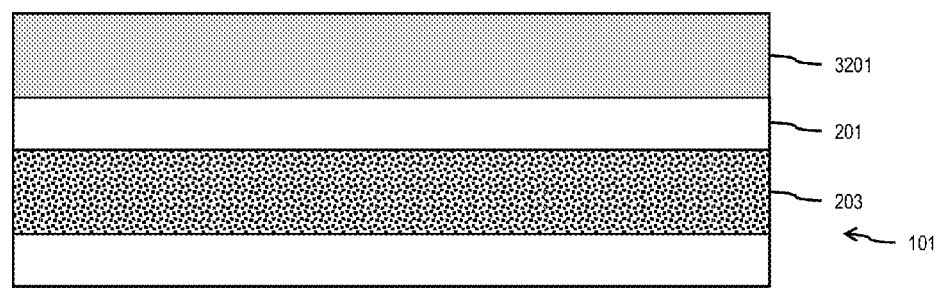

Adverting to FIG. 31, an alternative method to the method described above with respect to FIGS. 22 through 29 may begin with the substrate 101, the BOX layer 203 and the SOI layer 201. Next a first band-engineered layer 3201 may be formed above the SOI layer 201, as illustrated in FIG. 32. The first band-engineered layer 3201 may be formed with a decreasing concentration of Ge from a bottom surface of the first band-engineered layer 3201 to a top surface of the first band-engineered layer 3201. Likewise, the first band-engineered layer 3201 may be formed with an increasing concentration of Si from the bottom surface of the first band-engineered layer 3201 to the top surface of the first band-engineered layer 3201. Thus, the first band-engineered layer 3201 may be formed of $Si_x$—$Ge_y$, where x represents the concentration of Si increasing from 0 to 0.9 from the bottom surface of the first band-engineered layer 3201 and y represents the concentration of Ge decreasing from 1 to 0.1 from the bottom surface of the first band-engineered layer.

Alternatively, rather than a single band-engineered layer 3201 with decreasing and increasing Ge and Si concentrations, respectively, multiple band-engineered layers (e.g., a multi-layer stack) may form the first band-engineered layer 3201, where each layer has a different concentration of Ge and Si and the concentrations of Ge and Si across the layers decrease and increase respectively, as each layer is added.

Figure 33:
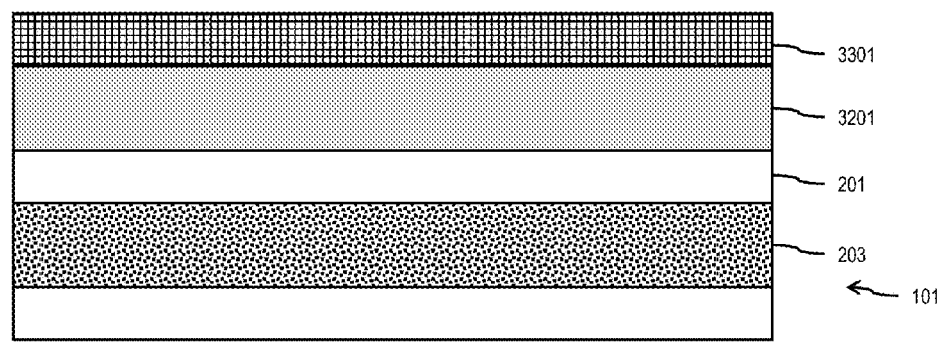
Figure 34:
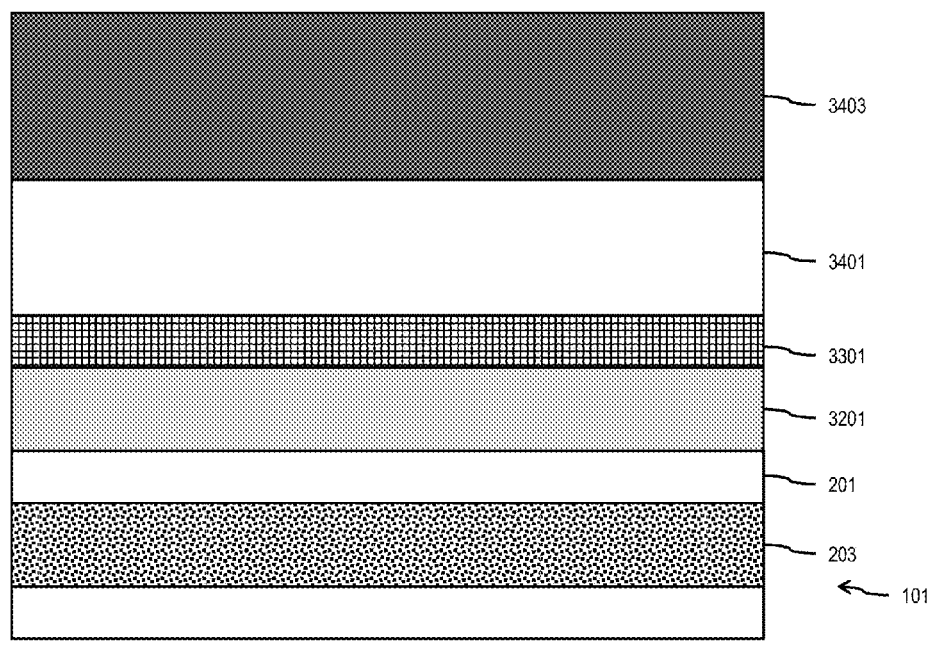
Figure 35:
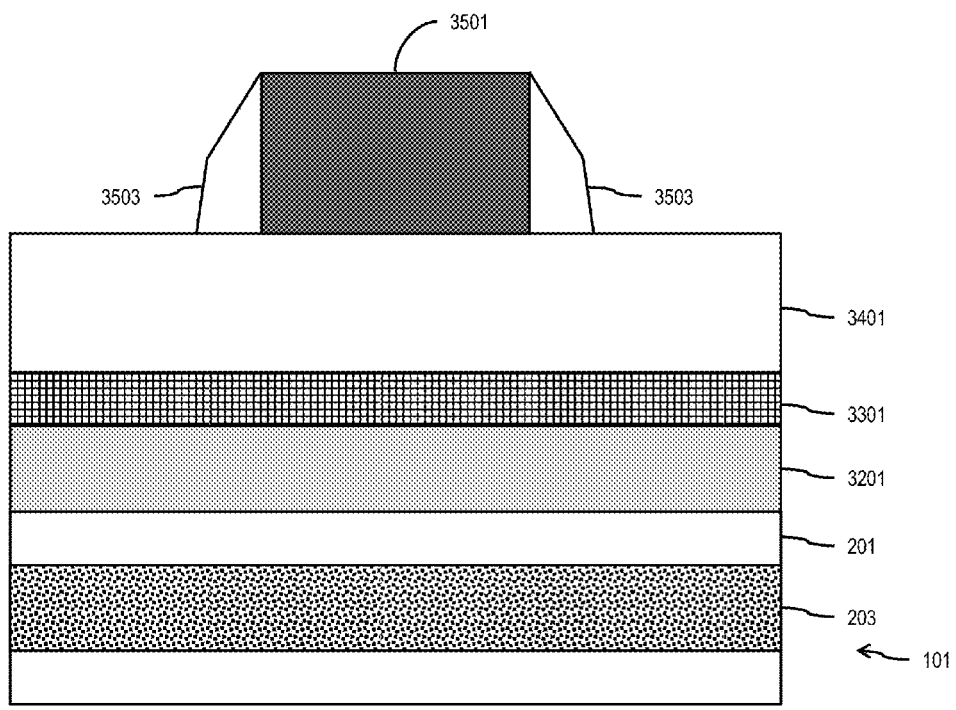
Figure 36:
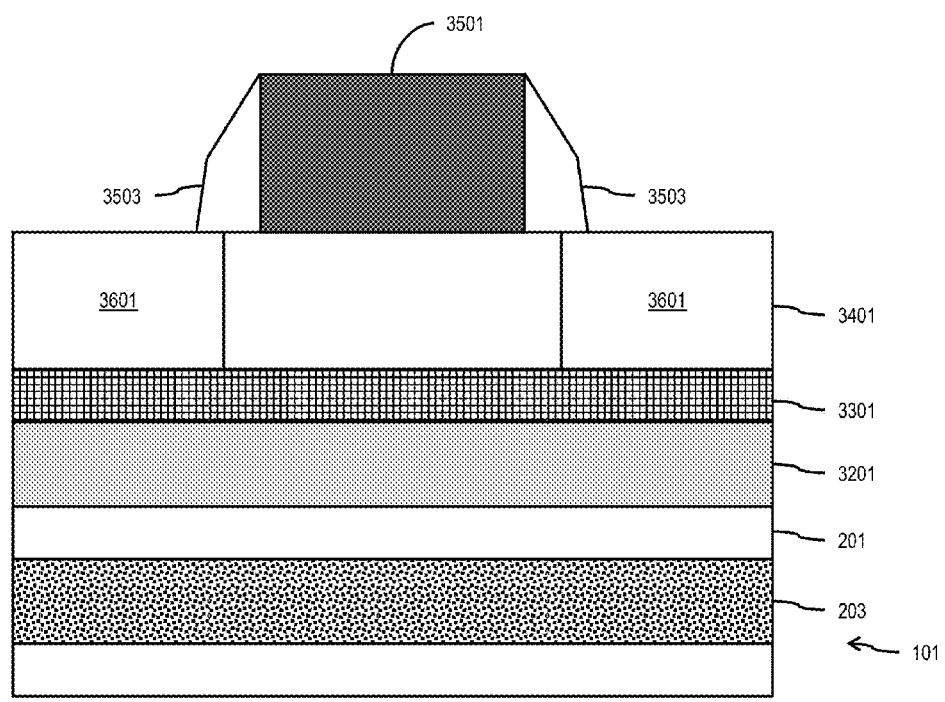

As illustrated in FIG. 33, a second band-engineered layer 3301 may be formed above the first band-engineered layer 3201, and may be formed similar to the band-engineered layers discussed above in the first two embodiments without a varying concentration of Si and/or Ge. Alternatively, the first band-engineered layer 3201 may be the only band-engineered layer formed above the SOI layer 201. Next, a Si layer 3401 is formed on the second band-engineered layer 3301 to a thickness of 5 to 30 nm, as illustrated in FIG. 34. Further, a sacrificial layer 3403 is formed above the Si layer 3401. The sacrificial layer 3403 may be subsequently patterned and etched to form the dummy gate 3501 illustrated in FIG. 35. Spacers 3503 of ILD material may be formed on opposite sides of the dummy gate 3501. Next, source and drain regions 3601 (FIG. 36) may be formed within the Si layer 3401 on either side of and below the spacers 3503. The source and drain regions 3601 may be laser annealed at 1000 to 1200° C.

Figure 37:
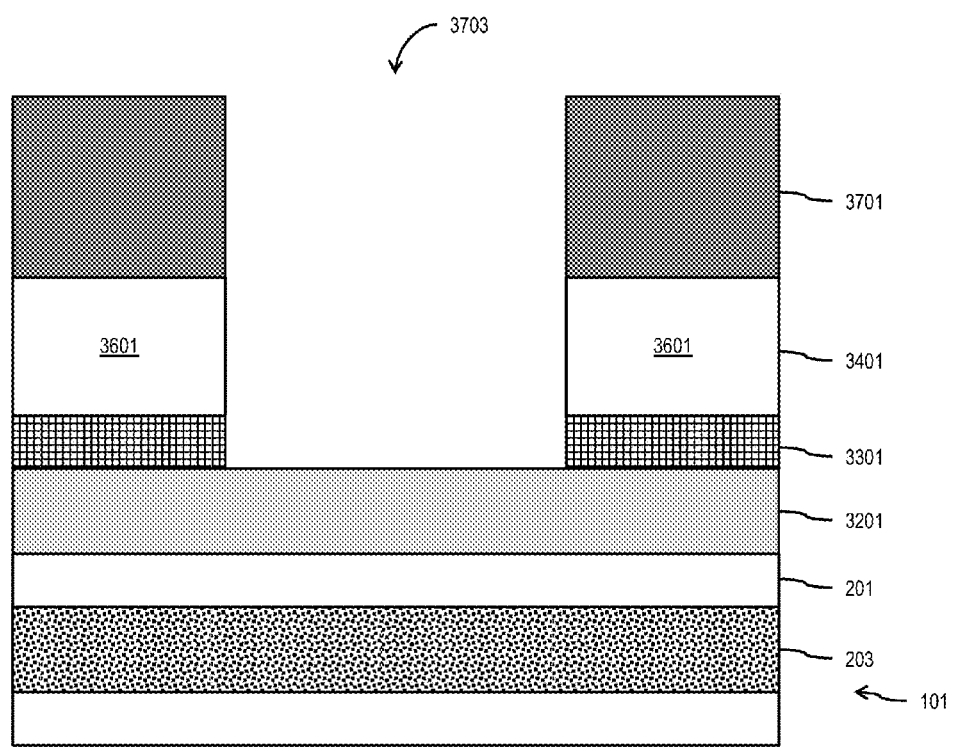
Figure 38:
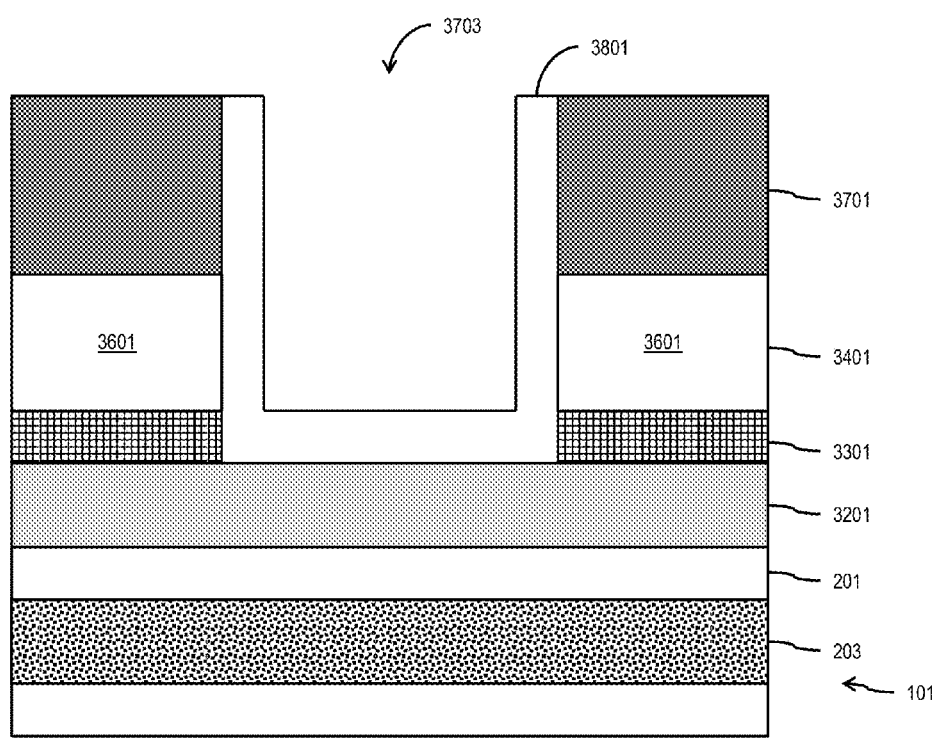
Figure 39:
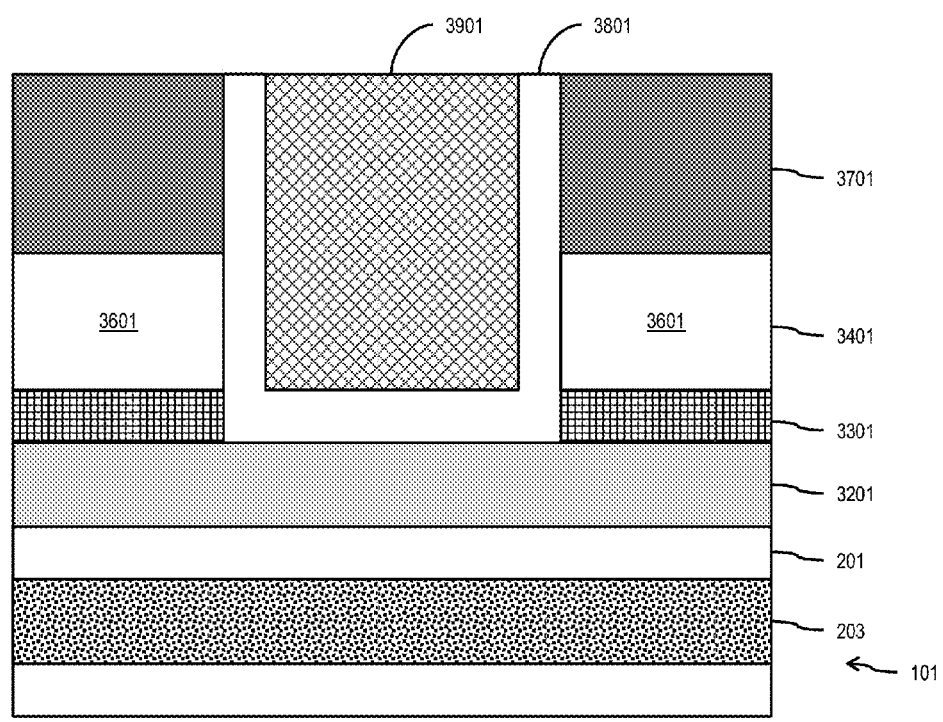

An ILD 3701 may be subsequently formed above the source and drain regions 3601, the dummy gate 2601 and the spacers 2603. The ILD 3701 may subsequently be removed down to the dummy gate 3501, such as by CMP, and the dummy gate 3501 and a portion of the Si layer 3401 and the second band-engineered layer 3301 directly below the dummy gate 3501 may be removed, forming the cavity 3703, as illustrated in FIG. 37. An etch may be used to remove the portion of the Si layer 3401 and the portion of the second band-engineered layer 3301 to form the cavity 3703. Next, a gate oxide layer 3801 may be formed on sidewalls and a bottom surface of the cavity 3703, as illustrated in FIG. 38. Adverting to FIG. 39, the cavity 3703 may be filled with a gate material 3901, such as poly-Si, resulting in an FBC with faster programming and a lower refresh rate and a deeper quantum well for hole storage.

Figure 40:
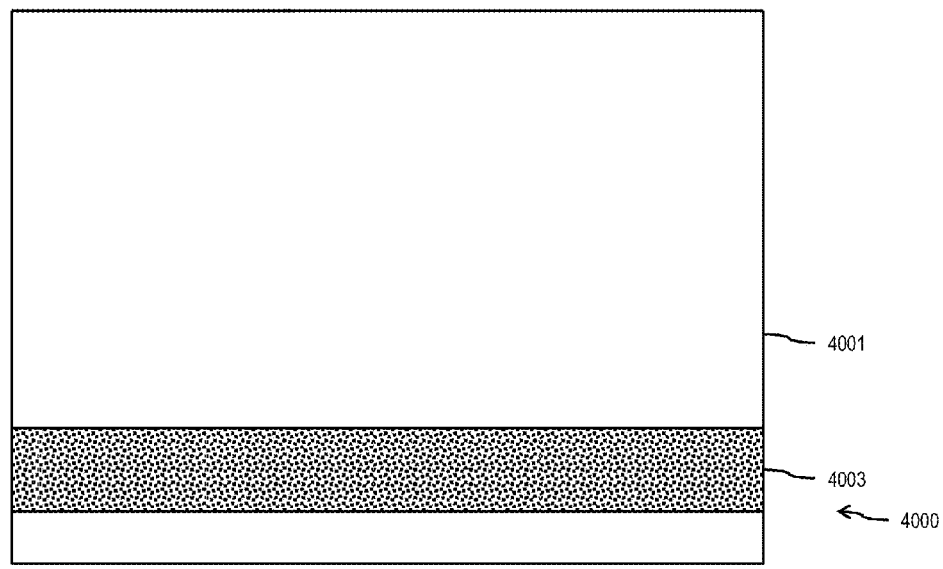
FIGS. 40 through 46 schematically illustrate a method for forming an alternative FBC with faster programming and a lower refresh rate, in accordance with an exemplary embodiment.

Adverting to FIG. 40, a method of forming an FBC with faster programming and a lower refresh rate and larger data storage volume, according to another exemplary embodiment, begins with a substrate 4000 formed of Si. Next, a BOX layer 4003 may be formed on the substrate 4000. The BOX layer 4003 may be formed by oxygen implantation in the substrate 4000 followed by a high temperature anneal to create the BOX layer 4003 formed of silicon dioxide or by bonding a BOX layer to the substrate. An SOI layer 4001 is formed above the BOX layer 4003. The SOI layer 4001 may be thickened, such as to a thickness of 50 to 80 nm, resulting in the thicker SOI layer 4001 as compared to the SOI layers discussed above.

Figure 41:
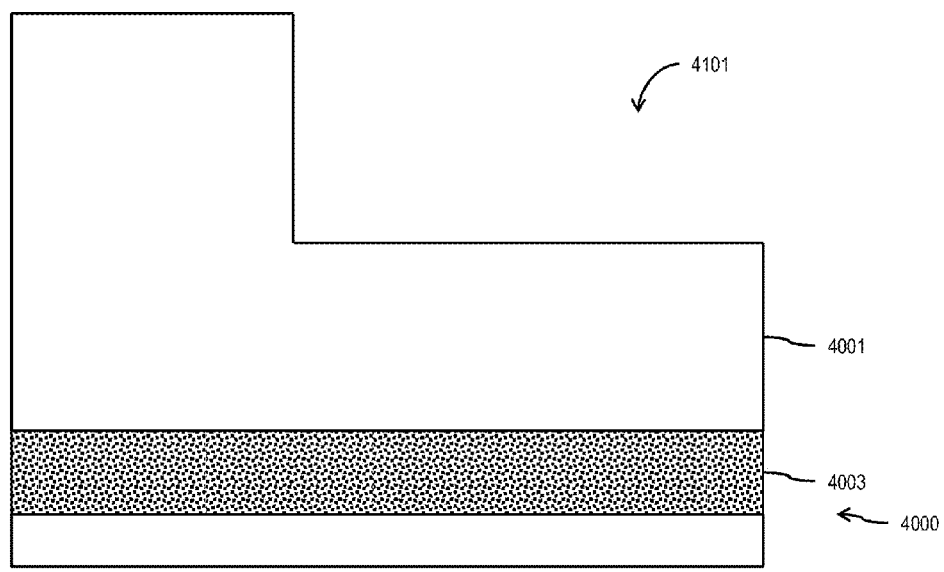
Figure 42:
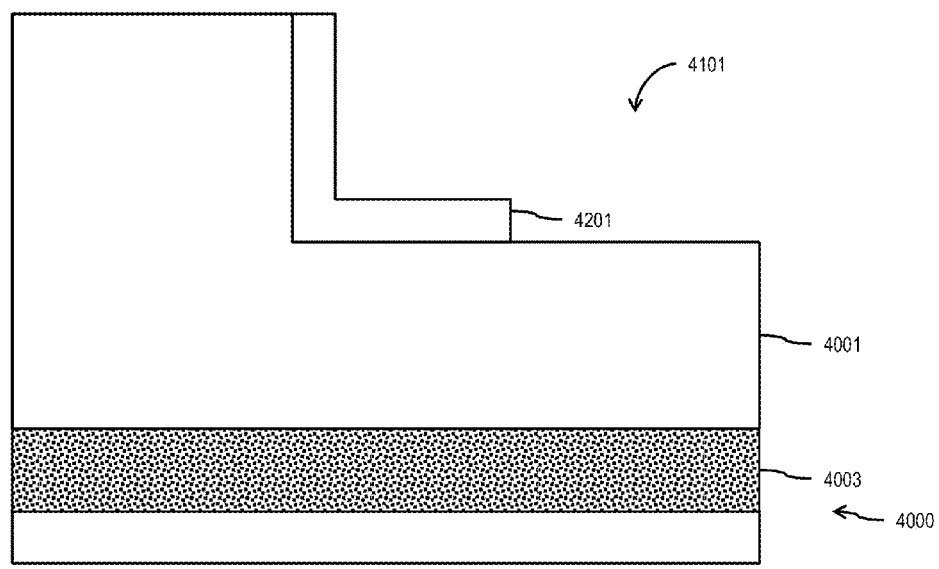
Figure 43:
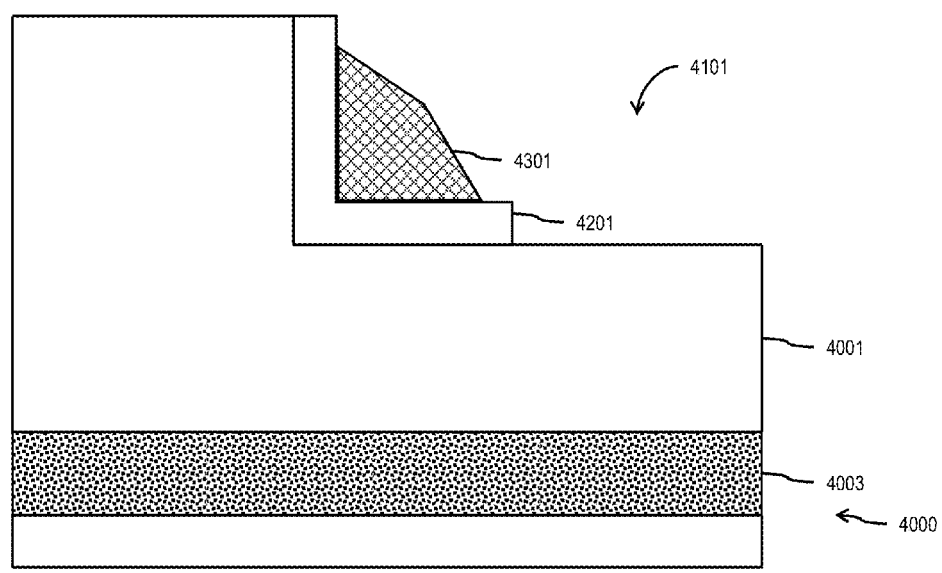
Figure 44:
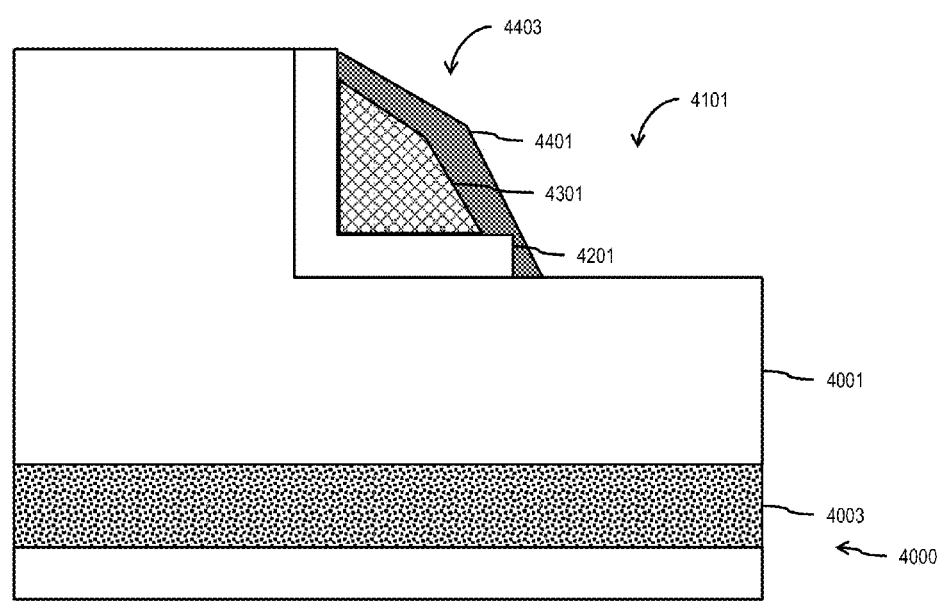

Next, the SOI layer 4001 may be etched according to any conventional etching process to form a recess 4101 to a depth of 10 to 30 nm, as illustrated in FIG. 41. Adverting to FIG. 42, a gate oxide material may be formed on a sidewall and portion of a bottom surface of the recess 4101 forming an L-shaped gate oxide layer 4201. After forming the L-shaped gate oxide layer 4201, a gate material 4301 (such as poly-Si) may be formed on the L-shaped gate oxide layer 4201, as illustrated in FIG. 43. A dielectric spacer 4401 may be subsequently deposited over the gate material 4301, as illustrated in FIG. 44, forming a gate stack 4403. Where the etch forms a pillar in the SOI layer 4001, the resulting gate stack is formed around the pillar. Where the etch forms a trench, the resulting gate stack is a conventional planar metal oxide semiconductor (MOS).

Figure 45:
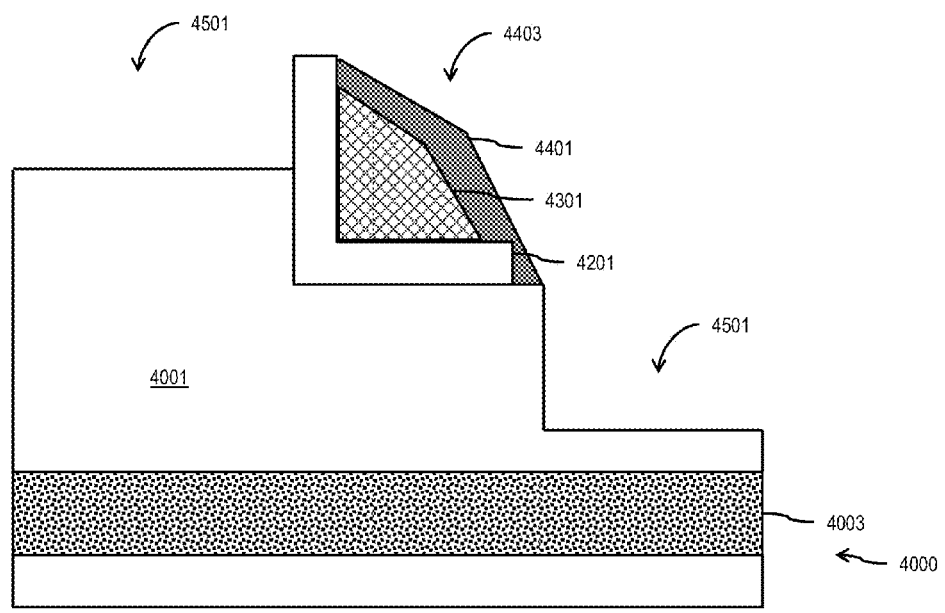
Figure 46:
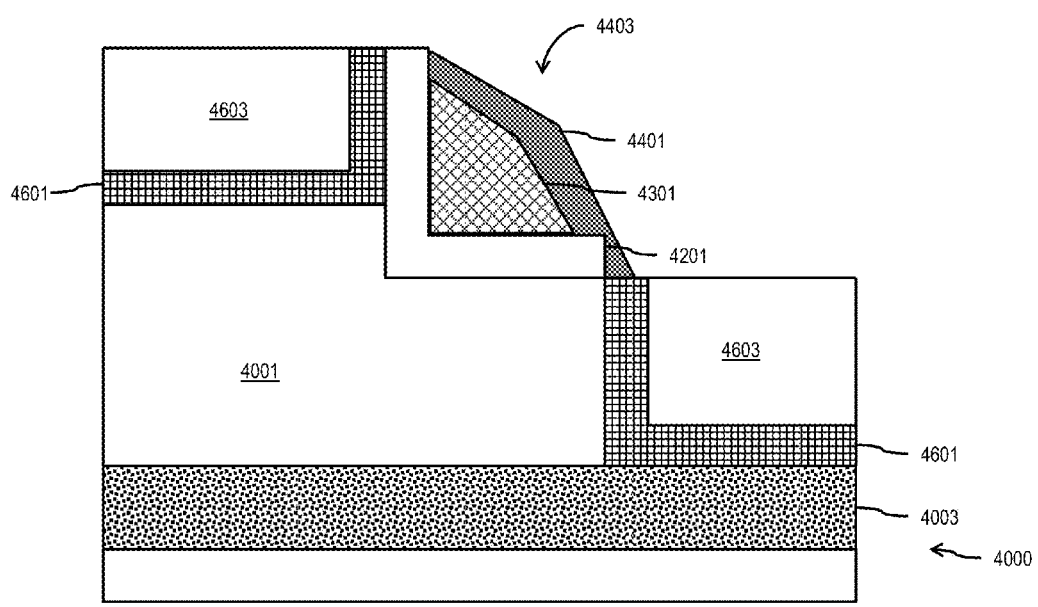

Adverting to FIG. 45, recesses 4501 may be formed on opposite sides of the gate 4403 to a depth of 10 to 30 nm. The recesses 4501 may subsequently be lined with a band-engineered layer 4601, as illustrated in FIG. 46. The band-engineered layer 4601 can be p-doped or un-doped Si—Ge or Ge when the SOI layer 4001 is p-type and may be formed to a thickness of 1 to 5 nm. Subsequently, the recesses 4501 may be filled with Si and in-situ doped to form source and drain regions 4603. Further, the source and drain regions 4603 may be laser annealed at 1000 to 1200° C. The result is an FBC with faster programming and a lower refresh rate and larger data storage volume.

Although the resulting FBC is illustrated as including the band-engineered layer 4601, alternatively the FBC may exclude the band-engineered layer 4601. In this case, the enlarged storage volume of the raised source and/or drain region 4603 and the SOI layer 4001 provides improved charge retention and a lowered refresh rate, though programming speed may be slower.

Figure 47:
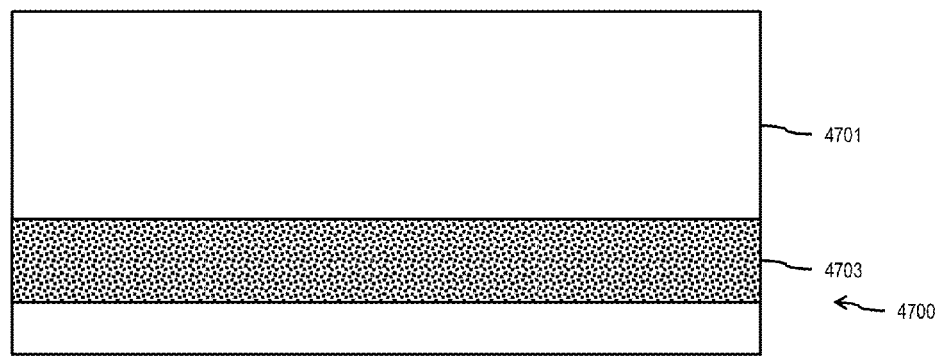
FIGS. 47 through 54 schematically illustrate a method for forming an alternative FBC with faster programming and a lower refresh rate, in accordance with an exemplary embodiment.

Adverting to FIG. 47, a method of forming an FBC with faster programming and a lower refresh rate, according to another exemplary embodiment, begins with a substrate 4700. The substrate 4700 may be formed of Si. Next, a BOX layer 4703 may be formed on the substrate 4700. The BOX layer 4703 may be formed by oxygen implantation in the substrate 4700 followed by a high temperature anneal to create the BOX layer 4703 formed of silicon dioxide or by bonding a BOX layer to the substrate. An SOI layer 4701 is formed above the BOX layer 4703. The SOI layer 4701 may be formed to a thickness of 50 to 80 nm.

Figure 48:
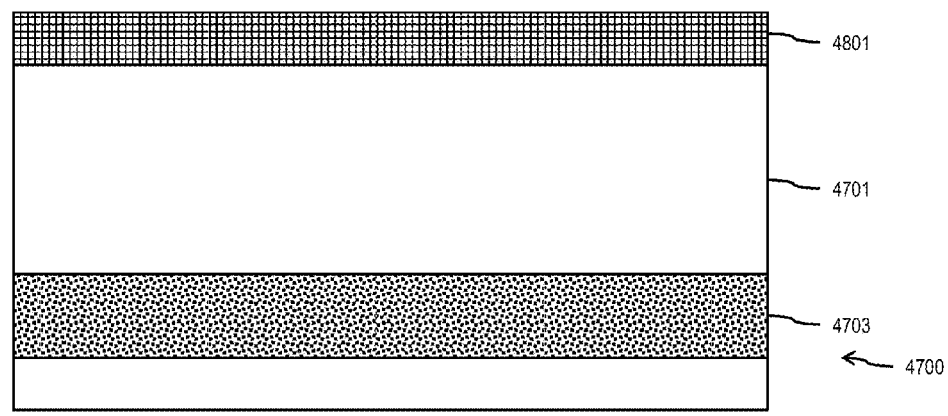
Figure 49:
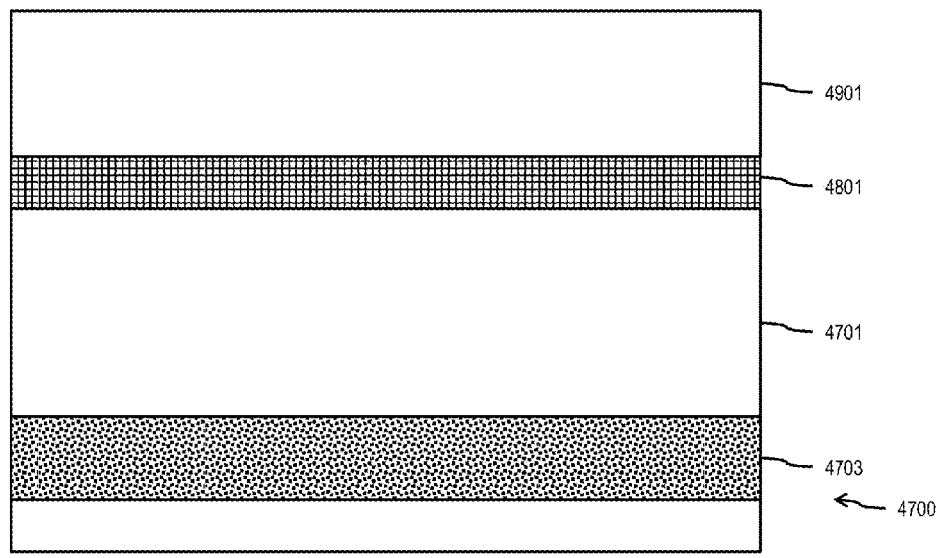
Figure 50:
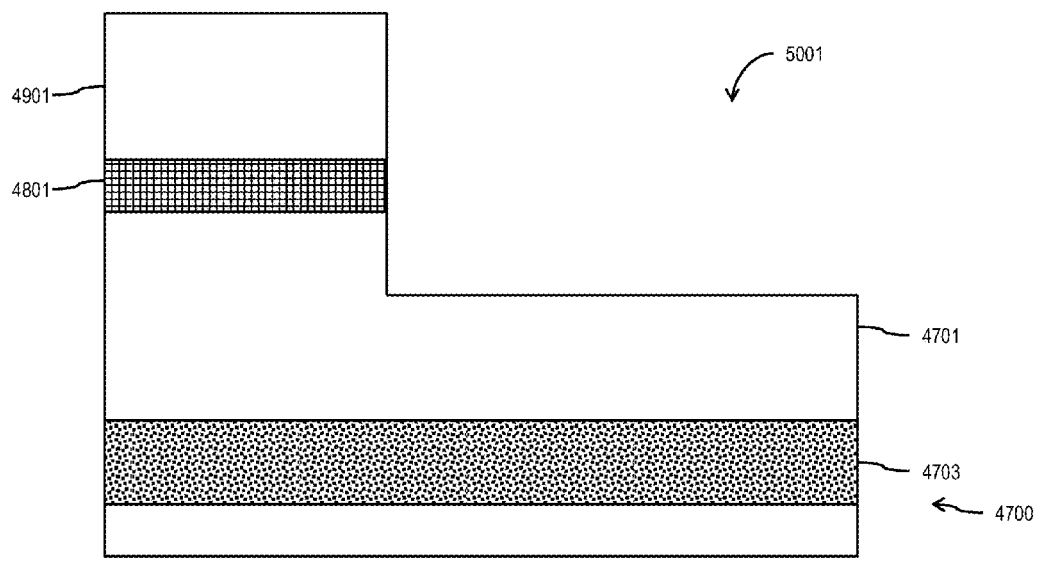
Figure 51:
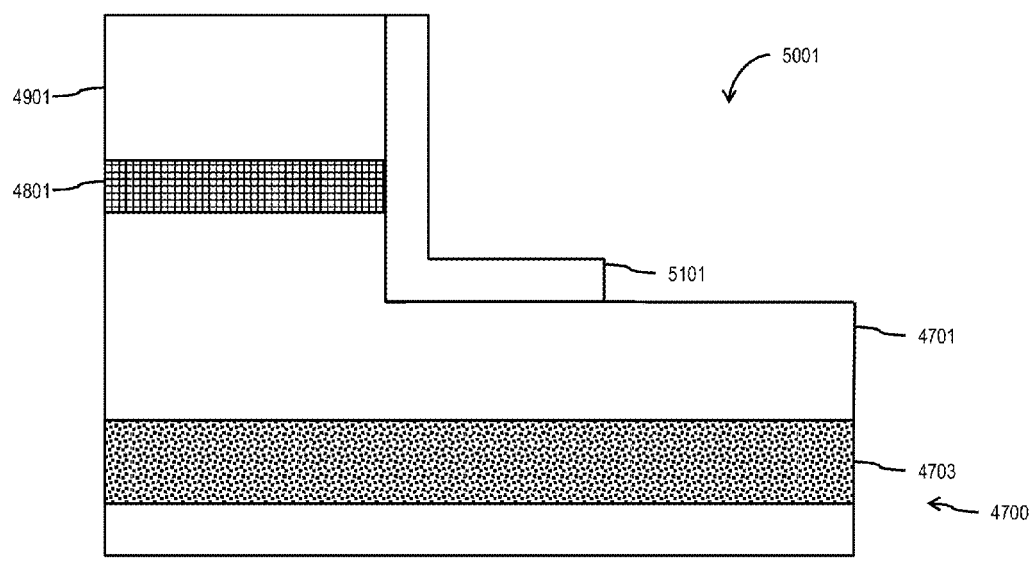
Figure 52:
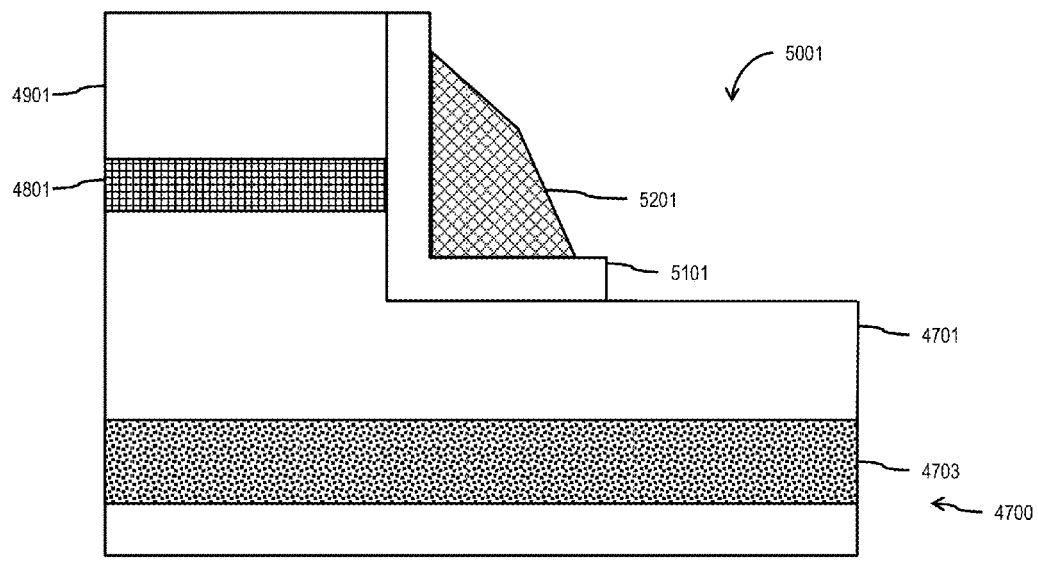
Figure 53:
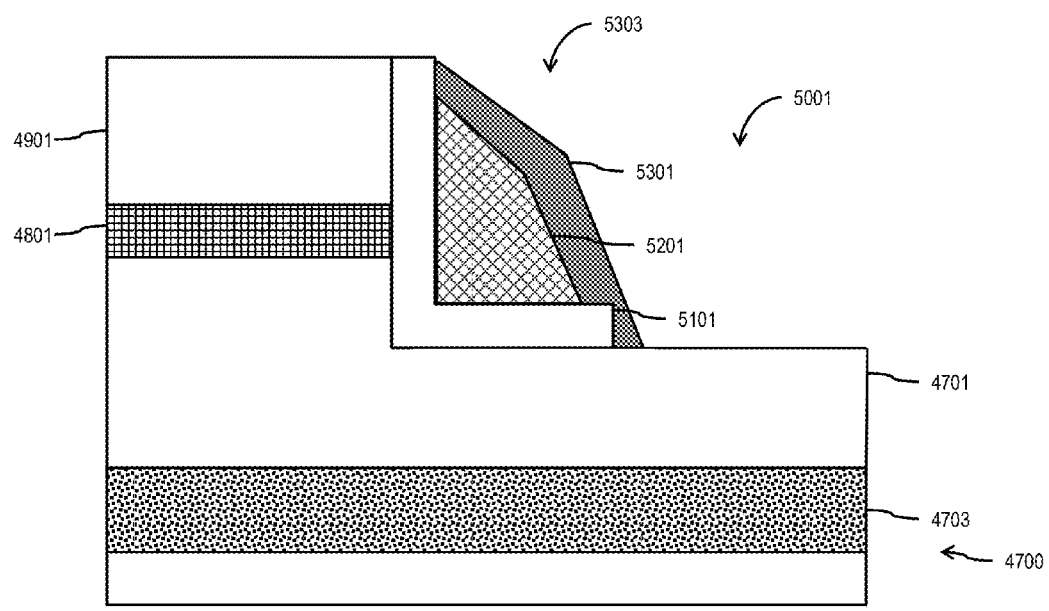

Subsequently, a band-engineered layer 4801 may be formed on the SOI layer 4701, as illustrated in FIG. 48. The band-engineered layer 4801 can be p-doped or un-doped Si—Ge or Ge when the SOI layer 4701 is p-type and may be formed to a thickness of 1 to 5 nm. Further, a Si layer 4901 is formed on the band-engineered layer 4801 (FIG. 49). Next, the Si layer 4901, the band-engineered layer 4801 and the SOI layer 4701 may be etched according to any conventional etching process to form a recess 5001 to a depth of 20 to 50 nm, as illustrated in FIG. 50. Adverting to FIG. 51, a gate oxide material may be formed on a sidewall and portion of a bottom surface of the recess 5001 forming an L-shaped gate oxide layer 5101. After forming the L-shaped gate oxide layer 5101, a gate material 5201 (such as poly-Si) may be formed on the L-shaped gate oxide layer 5101, as illustrated in FIG. 52. A dielectric spacer 5301 may be subsequently deposited over the gate material 5201, as illustrated in FIG. 53, forming a gate stack 5303.

Figure 54:
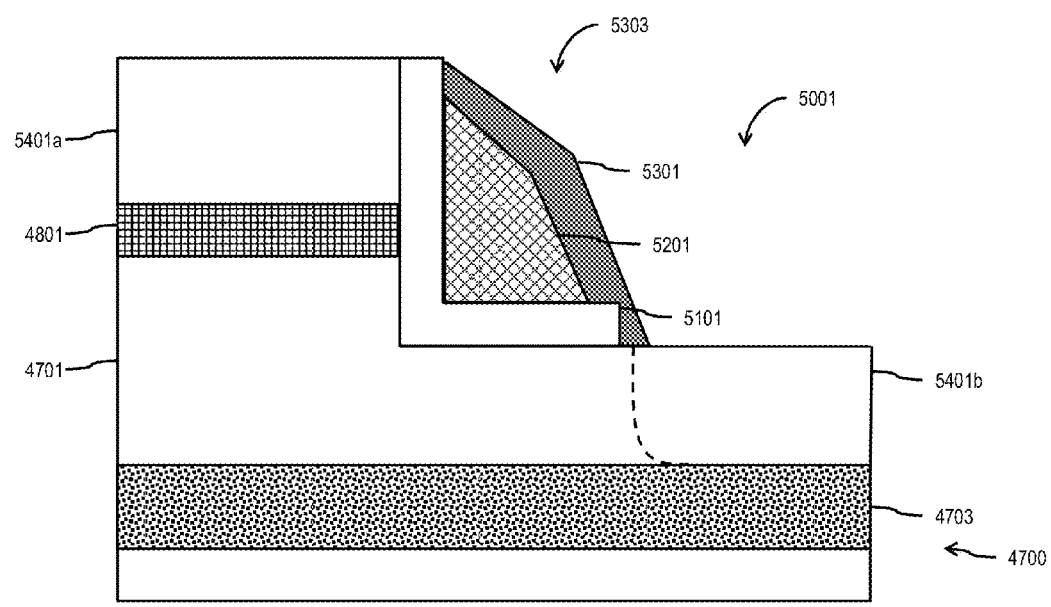

Adverting to FIG. 54, portions of the Si layer 4901 and the SOI layer 4701 may be implanted and laser annealed to form a drain region 5401a and a source region 5401b, respectively. Although in the embodiments above the source and drain regions may be on opposite sides of the gate based on the symmetry of the gate, for the embodiment discussed with respect to FIG. 54, the drain region 5401a is level with and/or above the gate 5303 within the Si layer 4901 and the source region 5401b is below the gate 5303 in the SOI layer 4701. The result is an FBC with faster programming and a lower refresh rate.

Although the resulting FBC is illustrated as including the band-engineered layer 4801, alternatively the FBC may exclude the band-engineered layer 4801. In this case, the enlarged storage volume of the raised drain region 5401a and the SOI layer 4701 provides improved charge retention and a lowered refresh rate.

The embodiments of the present disclosure achieve several technical effects, including an FBC with faster programming because of a higher rate of impact ionization, additional quantum well storage capability, improved charge retention and a lowered refresh rate. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a silicon on insulator (SOI) layer on a substrate;
   forming a band-engineered layer surrounding and/or on the SOI layer, the band-engineered layer formed as a multi-layer stack with a decreasing concentration of germanium (Ge) from a bottom surface of the multi-layer stack to a top surface of the multi-layer stack;
   forming a silicon layer on the band-engineered layer;
   forming a dummy gate on the silicon layer;
   forming a source region and a drain region with at least one of the source region and the drain region being on the band-engineered layer; and
   forming a gate on the SOI layer, between the source and drain regions, the gate formed by:
      removing the dummy gate, the silicon layer and the band-engineered layer below the dummy gate, forming a cavity;
      forming a gate oxide layer on sidewalls and a bottom surface of the cavity; and
      filling the cavity with a gate material.

2. The method according to claim 1, comprising:
   forming the gate prior to the band-engineered layer;
   forming a hard mask on the gate;
   recessing the SOI layer forming recesses on each side of the gate;
   forming the band-engineered layer lining the recesses;
   forming the source region and the drain region on the band-engineered layer; and
   removing the hard mask.

3. The method according to claim 2, further comprising:
   forming a gate oxide layer on the SOI layer prior to forming the gate; and
   forming the source and drain regions coplanar with the gate oxide layer.

4. The method according to claim 1, further comprising:
   recessing the SOI layer;
   forming a gate oxide layer on a sidewall and a bottom surface of the recess;
   forming a gate on the gate oxide layer;
   recessing the SOI layer on each side of the gate;
   forming the band-engineered layer on the recessed SOI layer; and
   forming the source region and the drain region on the band-engineered layer.

5. The method according to claim 1, comprising:
   forming a silicon layer on the band-engineered layer;
   etching a portion of the silicon layer, the band-engineered layer, and the SOI layer;
   forming a gate oxide layer on a sidewall and a bottom surface of the etched portion; and
   forming a gate on the gate oxide layer, prior to forming the source and drain regions.

6. The method according to claim 1, comprising:
   forming a buried oxide (BOX) layer between the substrate and the SOI layer.

7. A device comprising:
   a silicon on insulator (SOI) layer on a substrate;
   a gate on the SOI layer;
   a gate oxide layer on side and bottom surfaces of the gate;
   a band-engineered layer on the SOI layer, on at least one side of the gate, the band-engineered layer formed as a multi-layer stack with a decreasing concentration of germanium (Ge) from a bottom surface of the multi-layer stack to a top surface of the multi-layer stack; and
   a source region and a drain region at opposite sides of the gate, at least one of the source region and the drain region being on the band-engineered layer,
   wherein the band-engineered layer is on both sides of the gate.

8. The device according to claim 7, wherein:
   the SOI layer is recessed on each side of the gate;
   the band-engineered layer lining each recess; and
   both the source region and the drain region are formed on the band-engineered layer.

9. The device according to claim 8, wherein:
   the source region and the drain region extend above a top surface of the SOI layer.

10. The device according to claim 7, wherein:
    a portion of the SOI layer is recessed;
    a gate oxide layer lines a side surface and a portion of a bottom surface of the recess, forming an L-shape;
    the gate is formed on the gate oxide layer; and
    the band-engineered layer is on a non-recessed portion of the SOI layer.

11. The device according to claim 7, comprising:
    a first recess in the SOI layer having a first depth;
    a gate oxide layer lining a side surface and a portion of a bottom surface of the first recess, forming an L-shape;
    the gate being formed on the gate oxide layer;
    a second recess in the SOI layer having a second depth, less than the first depth at one side of the gate;
    a third recess in the SOI layer having a third depth at the other side of the gate,
    wherein the band-engineered layer lines the second and third recesses and both the source region and the drain region are formed on the band-engineered layer.

12. The device according to claim 7, further comprising a buried oxide (BOX) layer under the SOI layer.

13. A method comprising:
    forming a buried oxide (BOX) layer on a silicon substrate;
    forming a silicon on insulator (SOI) layer on the BOX layer;
    forming a gate oxide,
    forming a gate on the SOI layer;
    forming a band-engineered layer on the SOI layer at least at one side of the gate, the band-engineered layer formed as a multi-layer stack with a decreasing concentration of germanium (Ge) from a bottom surface of the multi-layer stack to a top surface of the multi-layer stack;
forming a silicon layer on the band-engineered layer; and
forming source and drain regions at opposite sides of the gate, each in either the silicon layer or the SOI layer,
wherein the gate oxide layer is formed on a bottom surface and at least one side surface of the gate.

* * * * *